(12) United States Patent
Takechi

(10) Patent No.: US 10,707,293 B2
(45) Date of Patent: Jul. 7, 2020

(54) DISPLAY DEVICE

(71) Applicant: TIANMA JAPAN, LTD., Kawasaki, Kanagawa (JP)

(72) Inventor: Kazushige Takechi, Kawasaki (JP)

(73) Assignee: TIANMAN JAPAN, LTD., Kawasaki, Kanagawa (JP)

( * ) Notice: Subject to any disclaimer, the term of this patent is extended or adjusted under 35 U.S.C. 154(b) by 0 days.

(21) Appl. No.: 16/288,785

(22) Filed: Feb. 28, 2019

(65) Prior Publication Data
US 2019/0273125 A1  Sep. 5, 2019

(30) Foreign Application Priority Data

Mar. 1, 2018 (JP) .................................. 2018-036636
Jul. 18, 2018 (JP) .................................. 2018-135339

(51) Int. Cl.
*H01L 27/32* (2006.01)
*H01L 51/52* (2006.01)
*H01L 27/12* (2006.01)

(52) U.S. Cl.
CPC ...... *H01L 27/3279* (2013.01); *H01L 27/3262* (2013.01); *H01L 27/3265* (2013.01); *H01L 51/5218* (2013.01); *H01L 51/5228* (2013.01); *H01L 51/5234* (2013.01); *H01L 27/1225* (2013.01); *H01L 2227/323* (2013.01); *H01L 2251/5315* (2013.01)

(58) Field of Classification Search
CPC ............. H01L 27/3279; H01L 27/3262; H01L 51/5234; H01L 51/5218; H01L 27/3265; H01L 51/5228; H01L 27/1225; H01L 2251/5315; H01L 2227/323; H01L 27/1255; H01L 27/124; H01L 27/326; G09G 3/3233

See application file for complete search history.

(56) References Cited

U.S. PATENT DOCUMENTS

| 2002/0158835 | A1* | 10/2002 | Kobayashi | H01L 27/3244 345/100 |
| 2009/0141203 | A1* | 6/2009 | Son | G02F 1/136213 349/39 |
| 2014/0145156 | A1* | 5/2014 | Choi | H01L 27/3279 257/40 |
| 2014/0183479 | A1* | 7/2014 | Park | H01L 51/56 257/40 |

(Continued)

*Primary Examiner* — Syed I Gheyas
(74) *Attorney, Agent, or Firm* — Sughrue Mion, PLLC

(57) ABSTRACT

Each of pixels includes: a transparent upper electrode covering at least a part of the first region and at least a part of the second region; a reflective lower electrode disposed in the second region; a light-emitting film disposed between the transparent upper electrode and the reflective lower electrode, the light-emitting film being configured to emit light in response to supplied electric current; a thin film transistor disposed lower than the reflective lower electrode in the second region, the thin film transistor having a channel made of a transparent oxide; and a transparent low-resistive film that is made of the transparent oxide and interconnects the power-source potential supply line and the transparent upper electrode, the transparent low-resistive film being separate from an oxide film that is made of the transparent oxide and includes the channel and having a resistance lower than a resistance of the channel.

20 Claims, 16 Drawing Sheets

(56) References Cited

U.S. PATENT DOCUMENTS

2015/0179974 A1   6/2015  Matsuura
2016/0013256 A1   1/2016  Gai et al.
2016/0141339 A1*  5/2016  Prushinskiy ........ H01L 27/3218
                                                         257/40

* cited by examiner

DISPLAY DEVICE

CROSS-REFERENCE TO RELATED APPLICATIONS

This Non-provisional application claims priority under 35 U.S.C. § 119(a) on Patent Application No. 2018-36636 filed in Japan on Mar. 1, 2018 and Patent Application No. 2018-135339 filed in Japan on Jul. 18, 2018, the entire contents of which are hereby incorporated by reference.

BACKGROUND

This disclosure relates to a display device. Transparent displays have been proposed that display an image while allowing the background behind the display to be seen. Transparent displays can be used in an automotive window or a store window, for example. Transparent displays can utilize self-light-emitting elements, such as organic light-emitting diode (OLED) elements. An OLED element is a current-driven self-light-emitting element and therefore, eliminates the necessity of backlight. In addition to this, the OLED display element has advantages to achieve low power consumption, wide viewing angle, and high contrast ratio.

SUMMARY

An aspect of this disclosure is a display device including: a substrate; a plurality of pixels formed on the substrate, each of the plurality of pixels including a transparent first region and a second region different from the first region; and a power-source potential supply line lying through the second regions of the plurality of pixels and connected with a power line at outside of the plurality of pixels. Each of the plurality of pixels includes: a transparent upper electrode covering at least a part of the first region and at least a part of the second region; a reflective lower electrode disposed in the second region; a light-emitting film disposed between the transparent upper electrode and the reflective lower electrode, the light-emitting film being configured to emit light in response to supplied electric current; a thin film transistor disposed lower than the reflective lower electrode in the second region, the thin film transistor having a channel made of a transparent oxide; and a transparent low-resistive film that is made of the transparent oxide and interconnects the power-source potential supply line and the transparent upper electrode, the transparent low-resistive film being separate from an oxide film that is made of the transparent oxide and includes the channel and having a resistance lower than a resistance of the channel. The transparent low-resistive film is connected with the transparent upper electrode in the first region. The transparent low-resistive film is connected with the power-source potential supply line in the second region.

It is to be understood that both the foregoing general description and the following detailed description are exemplary and explanatory and are not restrictive of this disclosure.

EMBODIMENTS

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs. The drawings may exaggerate the sizes and the shapes of the elements for clear understanding of the description.

Overall Configuration of Transparent Display Device

An overall configuration of a transparent display device in this embodiment is described with reference to FIG. 1. In the following, an organic light-emitting diode (OLED) display device is described as an example of the transparent display device; however, the features of this disclosure are applicable to any self-light-emitting type of display devices other than the OLED display device, such as the quantum dot display device.

Figure 1:
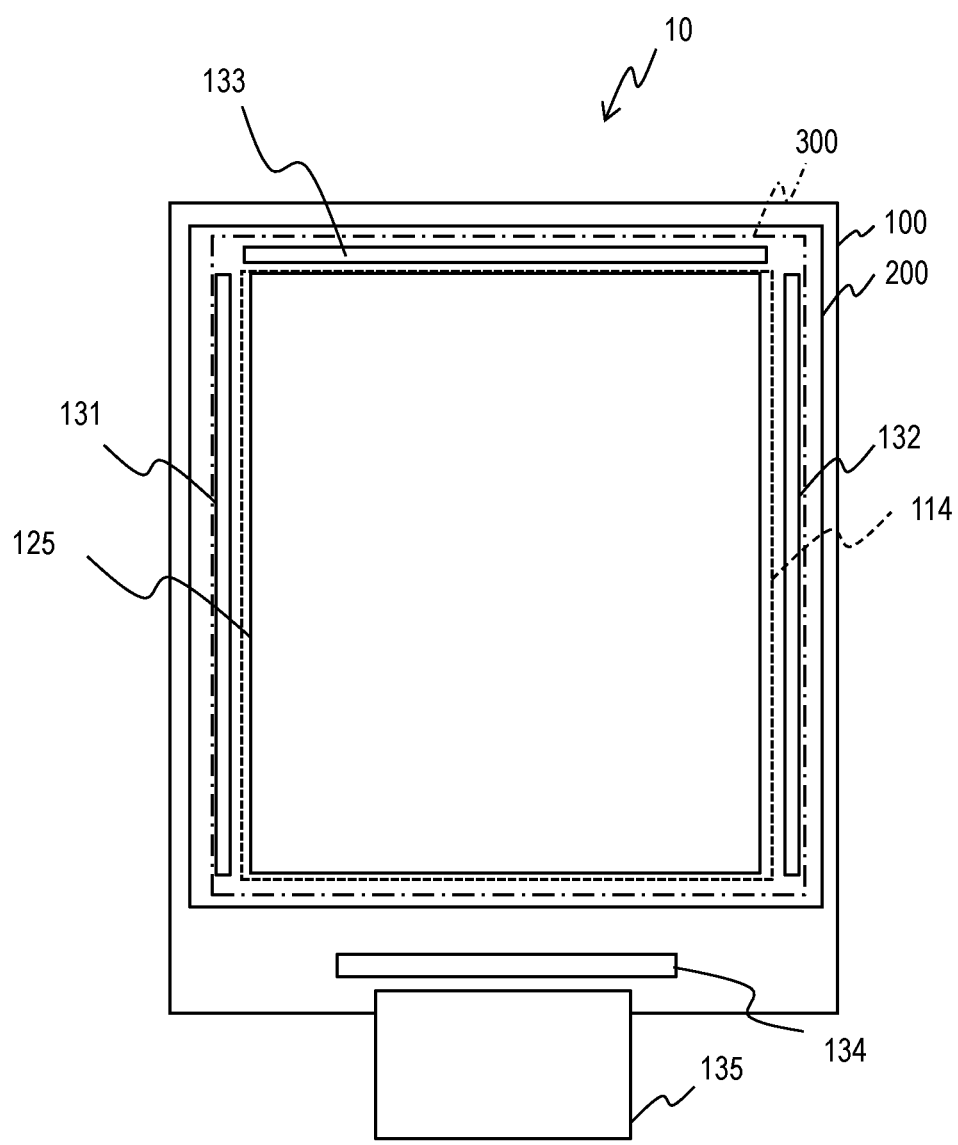
FIG. 1 schematically illustrates a configuration example of an OLED display device.

FIG. 1 schematically illustrates a configuration example of an OLED display device 10. The OLED display device 10 includes an OLED display panel and a control device. The OLED display panel includes a thin film transistor (TFT) substrate 100 on which OLED elements are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, a protection circuit 133, and a driver IC 134 are provided. These are connected to the external devices via flexible printed circuits (FPC) 135.

The scanning driver 131 drives scanning lines on the TFT substrate 100. The emission driver 132 drives emission control lines to control the light emission periods of subpixels. The protection circuit 133 protects the elements from electrostatic discharge. The driver IC 134 is mounted with an anisotropic conductive film (ACF), for example.

The driver IC 134 has display control functions. The driver IC 134 provides power and timing signals (control signals) to the scanning driver 131 and the emission driver 132 and further, provides signals corresponding to picture data to the data lines.

Hereinafter, a pixel consisting of subpixels of three colors of red (R), green (G), and blue (B) is referred to as main pixel. A subpixel or a main pixel may be referred to as pixel. The features of this disclosure are applicable to display devices having pixels in a color set different from the foregoing three colors or black-and-white display devices.

Configuration of Pixel Circuit

Figure 2A:
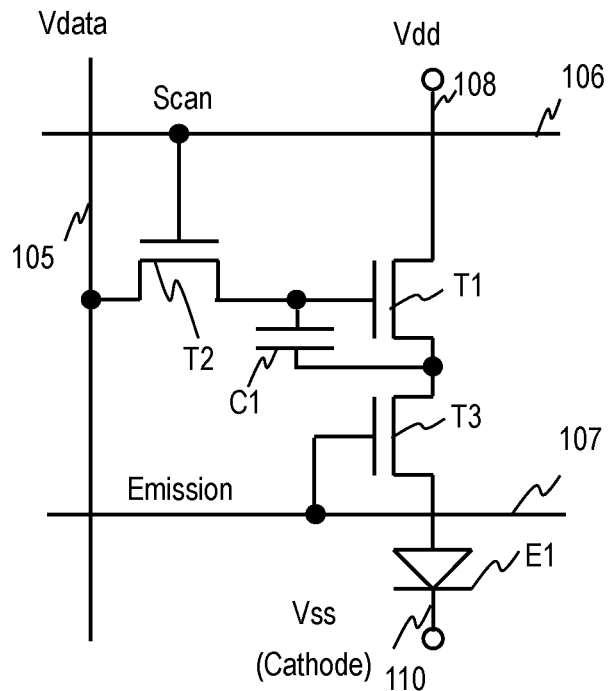
FIG. 2A illustrates a configuration example of a pixel circuit.

A plurality of pixel circuits are formed on the TFT substrate 100 to control the current to be supplied to the anode electrodes of subpixels. FIG. 2A illustrates a configuration example of a pixel circuit. Each pixel circuit includes a first transistor T1, a second transistor T2, a third transistor T3, and a storage capacitor C1. The pixel circuit controls light emission of an OLED element (self-light-emitting element) E1. The transistors are thin film transistors (TFTs). Hereinafter, the first transistor T1 to the third transistor T3 are abbreviated as transistor T1 to transistor T3.

The transistor T2 is a switch for selecting the subpixel. The transistor T2 is an n-channel TFT and its gate terminal is connected with a scanning line 106. The drain terminal is connected with a data line 105. The source terminal is connected with the gate terminal of the transistor T1.

The transistor T1 is a transistor (driving TFT) for driving the OLED element E1. The transistor T1 is an n-channel TFT and its gate terminal is connected with the source terminal of the transistor T2. The drain terminal of the transistor T1 is connected with a power line (Vdd) 108. The source terminal is connected with the drain terminal of the transistor T3. The storage capacitor C1 is generated between the gate terminal and the source terminal of the transistor T1.

The transistor T3 is a switch for controlling the supply/stop of the driving current to the OLED element E1. The transistor T3 is an n-channel TFT and its gate terminal is connected with an emission control line 107. The drain terminal of the transistor T3 is connected with the source terminal of the transistor T1. The source terminal is connected with the OLED element E1.

Next, operation of the pixel circuit is described. The scanning driver 131 outputs a selection pulse to the scanning line 106 to turn on the transistor T2. The data voltage supplied from the driver IC 134 through the data line 105 is stored to the storage capacitor C1. The storage capacitor C1 holds the stored voltage during the period of one frame. The conductance of the transistor T1 changes in an analog manner in accordance with the stored voltage, so that the transistor T1 supplies a forward bias current corresponding to a light emission level to the OLED element E1. The current flows from the OLED element E1 into the cathode power line (Vss) 110. The cathode power line 110 provides the cathode electrode with a predetermined potential Vss.

The transistor T3 is located on the supply path of the driving current. The emission driver 132 outputs a control signal to the emission control line 107 to control the on/off of the transistor T3. When the transistor T3 is on, the driving current is supplied to the OLED element E1. When the transistor T3 is off, this supply is stopped. The lighting period (duty ratio) in one field period can be controlled by controlling the on/off of the transistor T3.

Figure 2B:
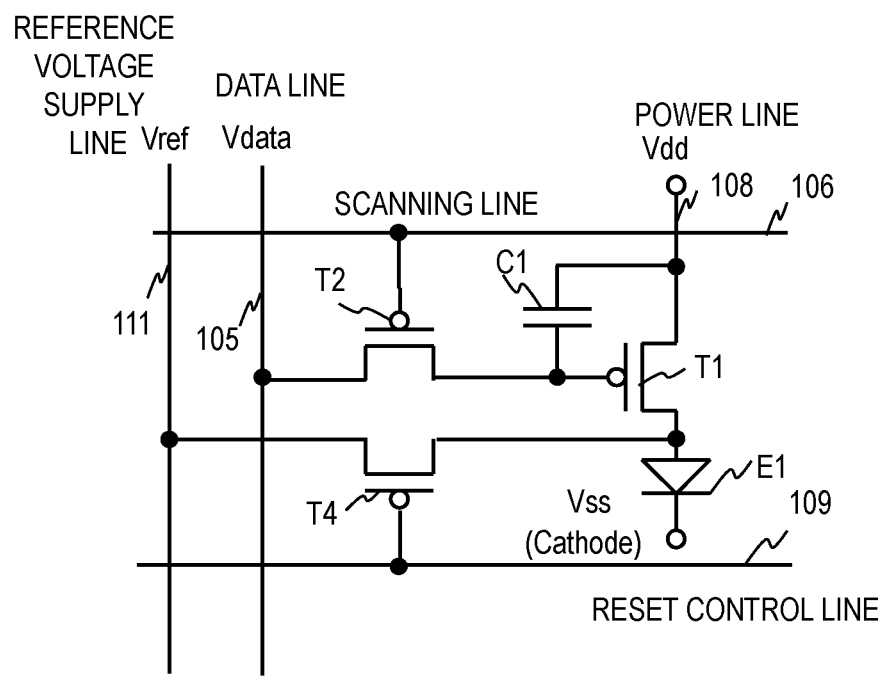
FIG. 2B illustrates another configuration example of a pixel circuit.

FIG. 2B illustrates another configuration example of a pixel circuit. This pixel circuit includes a reset transistor T4 in place of the emission transistor T3 in FIG. 2A. The reset transistor T4 controls the electric connection between a reference voltage supply line 111 and the anode of the OLED element E1. This control is performed in accordance with a reset control signal supplied from the reset control line 109 to the gate of the reset transistor T4.

The reset transistor T4 can be used for various purposes. For example, the reset transistor T4 can be used to reset the anode electrode of the OLED element E1 once to a sufficiently low voltage that is lower than the black signal level to prevent crosstalk caused by leak current between OLED elements E1.

The reset transistor T4 can also be used to measure a characteristic of the driving transistor T1. For example, the voltage-current characteristic of the driving transistor T1 can be accurately measured by measuring the current flowing from the power line (Vdd) 108 to the reference voltage supply line (Vref) 111 under the bias conditions selected so that the driving transistor T1 will operate in the saturated region and the reset transistor T4 will operate in the linear region. If the differences in voltage-current characteristic among the driving transistors T1 for individual subpixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 111 when the driving transistor T1 is off and the reset transistor T4 is operating in the linear region. In the case where the OLED element E1 is deteriorated because of long-term use, for example, if the deterioration is compensated for by generating a data signal at an external circuit, the display device can have a long life spun.

Figure 2C:
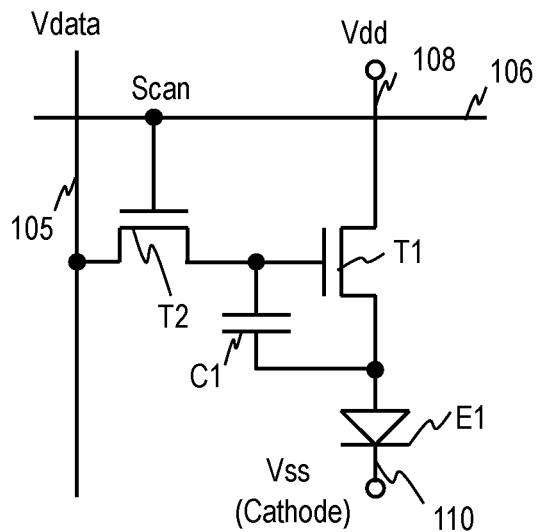
FIG. 2C illustrates still another configuration example of a pixel circuit.

The pixel circuit in FIG. 2C has a configuration in which the transistor T3 and the emission control line are omitted from the pixel circuit illustrated in FIG. 2A. The circuit configurations in FIGS. 2A, 2B, and 2C are examples; the pixel circuit may have a different circuit configuration. Although the pixel circuits in FIGS. 2A, 2B, and 2C use n-channel TFTs, the pixel circuit may employ p-channel TFTs.

Cathode Power Contact

Figure 3:
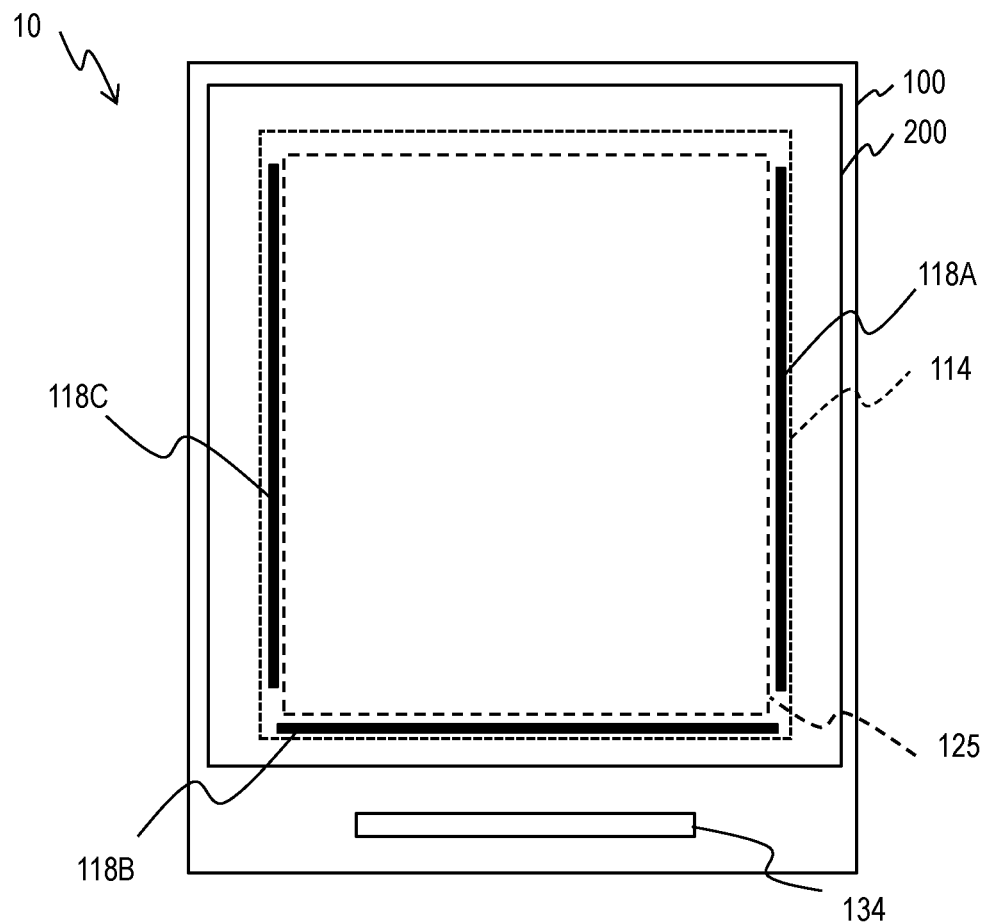
FIG. 3 schematically illustrates connection between a transparent conductive film including cathode electrodes of subpixels and cathode power lines.

FIG. 3 schematically illustrates connection between a transparent conductive film including the cathode electrodes of subpixels and cathode power lines. The cathode electrode of each subpixel is a part of a sheet-like unseparated transparent conductive film; the periphery of the transparent conductive film coincides with the periphery of the cathode electrode forming region 114. Hereinafter, this transparent conductive film is referred to as cathode electrode or cathode conductive film.

Contact regions 118A, 118B, and 118C of the transparent conductive film with cathode power lines (Vss) 110 are provided outer than the display region 125 but within the cathode electrode forming region 114. The transparent conductive film is connected with the cathode power lines 110 in the contact regions 118A, 118B, and 118C. The transparent conductive film can be directly in contact with the cathode electrode forming region 114 or connected through interconnectors in the contact regions.

Considering the cathode electrodes of individual subpixels separately, a cathode electrode closer to the center of the transparent conductive film is more distant from a contact region; as a result, the resistance (cathode resistance) between the cathode electrode and the contact region becomes larger. The configuration example disclosed hereinafter includes auxiliary lines connecting the transparent conductive film and the cathode power lines 110. The auxiliary lines are metal films having a sheet resistance smaller than that of the cathode electrode and therefore, the difference in luminance between the central region and the peripheral region in the display region 125 caused by the cathode resistance can be diminished. The auxiliary lines are power-source potential supply lines for supplying a source potential to the cathode electrode.

Pixel Configuration

Figure 4:
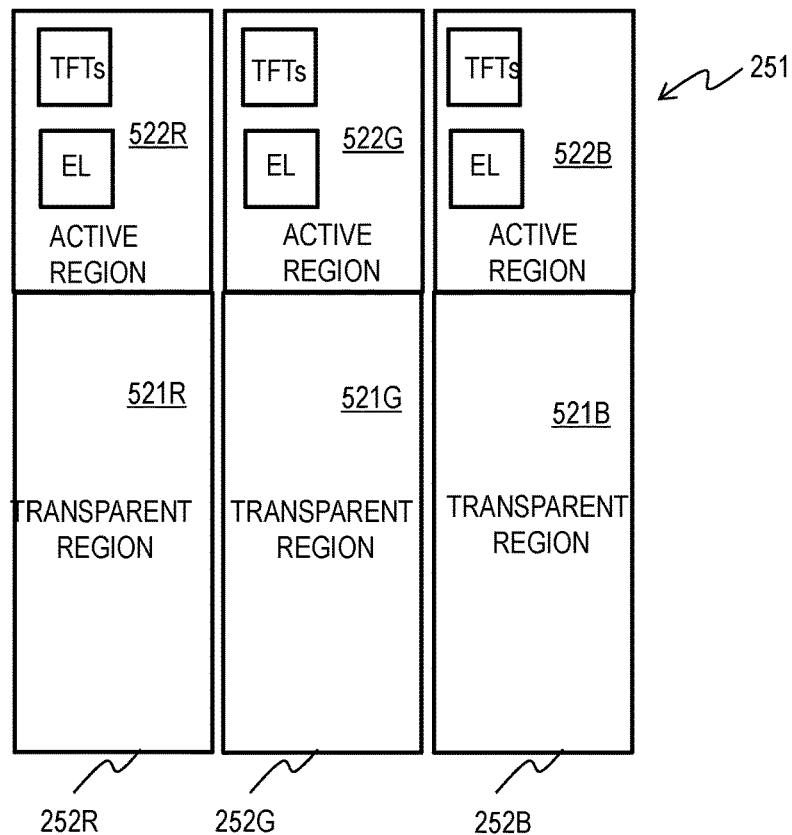
FIG. 4 is a plan diagram schematically illustrating a configuration example of a main pixel.

FIG. 4 is a plan diagram schematically illustrating a configuration example of a main pixel. One main pixel 251 consists of three subpixels: a red subpixel 252R, a green subpixel 252G, and a blue subpixel 252B. Each subpixel is associated with one pixel circuit. The boundary of a pixel is defined depending on the relation of the adjacent subpixel sets that are disposed cyclically; a pixel can have a rectangular shape or a shape other than a rectangle.

The region of the subpixel 252R is composed of a transparent region 521R (an example of transparent first region) and an active region (an example of second region) 522R. The region of the subpixel 252G is composed of a transparent region 521G (an example of transparent first region) and an active region (an example of second region) 522G. The region of the subpixel 252B is composed of a transparent region 521B (an example of transparent first region) and an active region (an example of second region) 522B.

In the example of FIG. 4, the subpixels 252R, 252G, and 252B of different colors include similar transparent regions and active regions; however, the shapes and the sizes can be different among the subpixels of different colors. Hereinafter, one given subpixel is denoted by a reference sign 252 and its transparent region and active region are denoted by reference signs 521 and 522, respectively.

The transparent region 521 transmits visible light from behind the display panel toward the front. The user is in front of the OLED display device 10 to see the displayed image. Since every subpixel 252 includes a transparent region 521, the user recognizes the whole display region 125 as a transparent region through which the user can see behind the display panel.

The active region 522 is a region of a subpixel 252 outside the transparent region 521. The OLED element (EL) and the plurality of TFTs in a pixel circuit are provided in the active region 522.

Subpixel Configuration

Hereinafter, the structure of a subpixel is described. The TFTs in a pixel circuit is oxide semiconductor TFTs. As an example of the oxide semiconductor TFT, the following description employs InGaZnO (IGZO) TFT. IGZO semiconductor is a transparent amorphous oxide semiconductor. The features of this disclosure are applicable to subpixels and OLED display devices including TFTs utilizing another transparent oxide semiconductor such as ZnO or InSnZnO (ITZO).

Figure 5A:
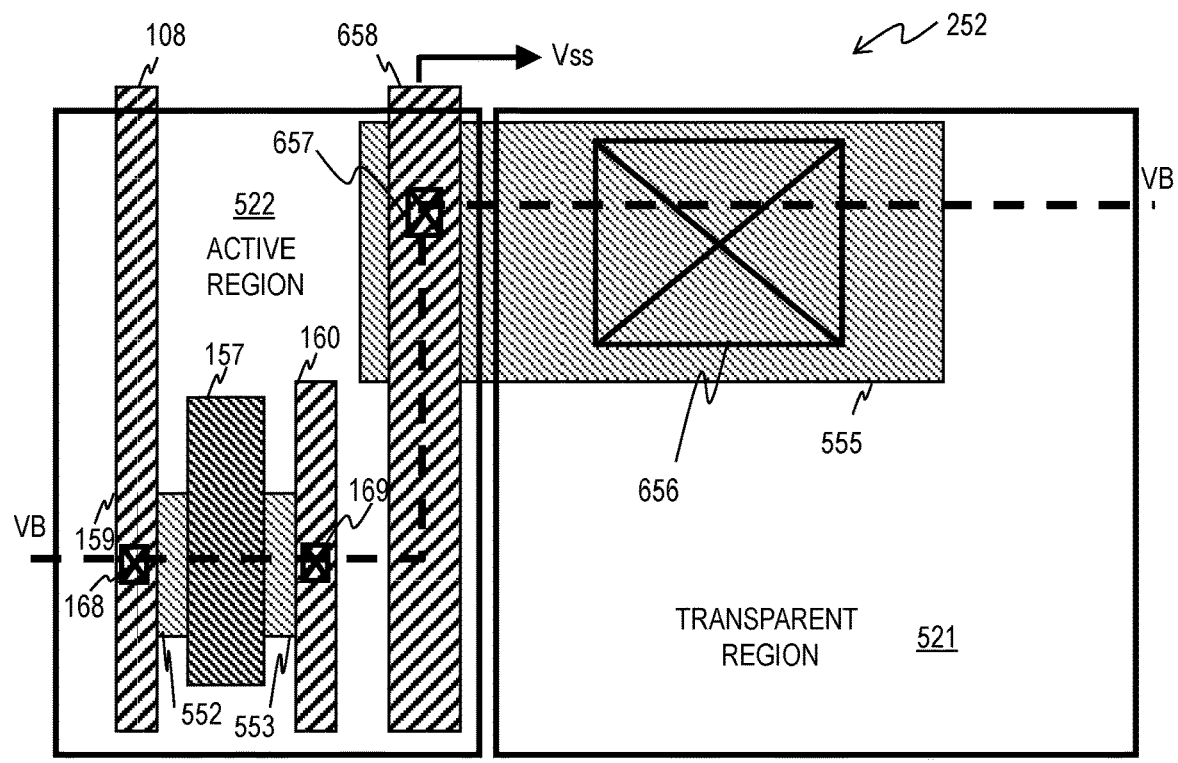
FIG. 5A is a plan diagram schematically illustrating a configuration example of a subpixel.

FIG. 5A is a plan diagram schematically illustrating a configuration example of a subpixel 252. FIG. 5A includes a part of the elements of the subpixel 252. The subpixel 252 includes a transparent region 521 and an active region 522. In the example of FIG. 5A, the periphery of the active region 522 substantially coincides with the periphery of an anode electrode 162.

In the active region 522, a driving TFT T1 is disposed (formed). Although the other transistors of the pixel circuit are not illustrated in FIG. 5A, they are disposed (formed) within the active region 522. The driving TFT T1 includes a gate electrode 157, a drain electrode 159, a source electrode 160, and an IGZO film connected with the drain electrode 159 and the source electrode 160. FIG. 5A illustrates a low-resistive contact region (drain region) 552 and a low-resistive contact region (source region) 553 of the IGZO film.

The drain electrode 159 of the driving TFT T1 is connected with a power line (Vdd) 108. In the example of FIG. 5A, the drain electrode 159 and the power line (Vdd) 108 are parts of the same metal film. The power line (Vdd) 108 passes through the active region 522 avoiding the transparent region 521.

The drain electrode 159 and the drain region 552 of the IGZO film are interconnected at a contact (contact region) 168. The source electrode 160 and the source region 553 of the IGZO film are interconnected at a contact (contact region) 169.

An auxiliary line 658 (an example of power-source potential supply line) lies through the active region 522, avoiding the transparent region 521. The auxiliary line 658 interconnects a cathode conductive film, a part of which is a cathode electrode, and a cathode power line to reduce the degradation in display quality caused by the cathode resistance. The auxiliary line 658 is made of metal and its sheet resistance is smaller than the sheet resistance of the cathode conductive film. The auxiliary line 658 is opaque (has light blocking property); the auxiliary line 658 lying through the active region 522 contributes to a larger transparent region 521, increasing the precision of the OLED display device.

The auxiliary line 658 is connected with an interconnector 555 of a low-resistive IGZO film at a contact 657 in the active region 522. The resistivity of the low-resistive IGZO film is higher than the resistivity of a typical metal by two digits. The interconnector 555 is a transparent low-resistive IGZO film having the same resistivity as a conductor. The interconnector 555 extends from the active region 522 into the transparent region 521.

The electrical conductivity of IGZO and other oxide semiconductors increases because of their defects. For example, donor defects caused by oxygen deficiency increase the electrical conductivity of IGZO. ZnO has n-type uni-polarity because of interstitial Zn or oxygen vacancy.

The interconnector 555 is connected with the cathode conductive film in a contact region 656 within the transparent region 521. The transparent interconnector 555 contributes to a larger transparent region 521 to increase the precision of the transparent OLED display device. The interconnector 555 is a low-resistive IGZO film; it can be formed together with the IGZO films of the TFTs, achieving high manufacturing efficiency.

Figure 5B:
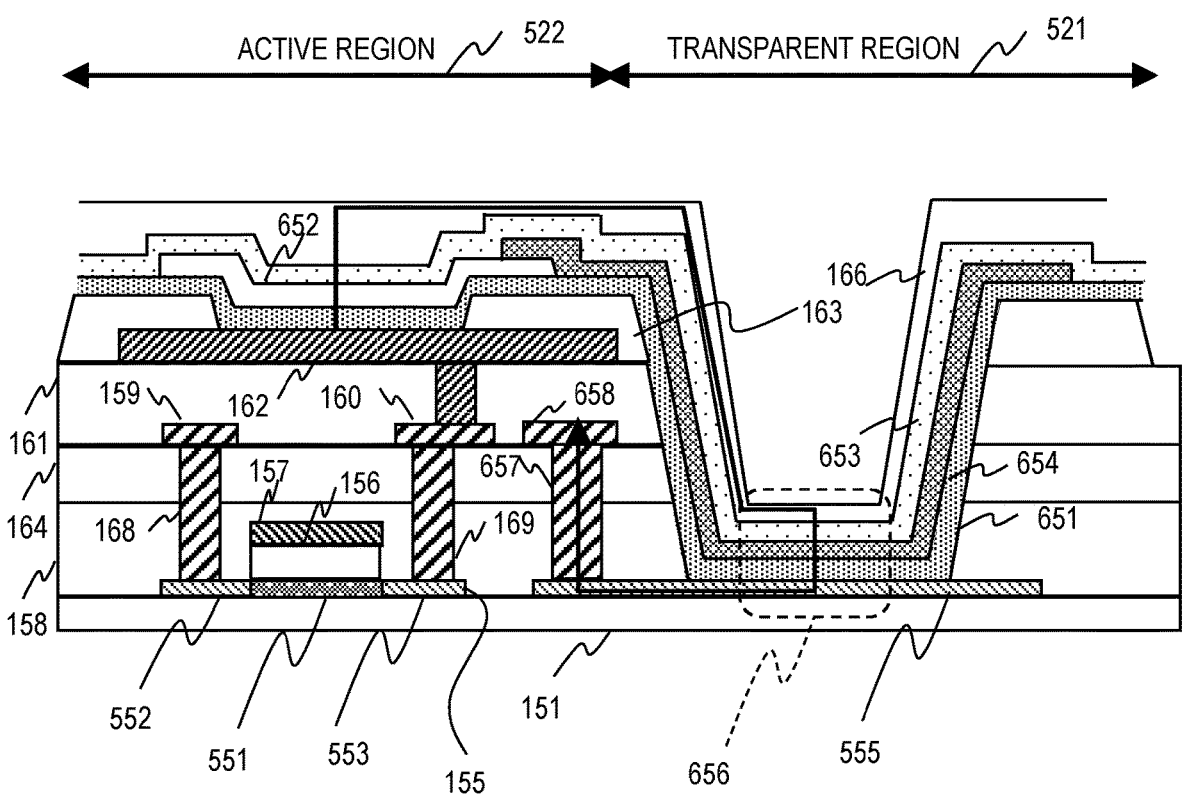
FIG. 5B is a cross-sectional diagram of the subpixel cut along the line VB-VB in FIG. 5A.

FIG. 5B is a cross-sectional diagram of the subpixel 252 cut along the line VB-VB in FIG. 5A. For clear understanding of the illustration, the size proportions of the elements in FIG. 5B are different from the size proportions of the elements in FIG. 5A. FIG. 5B illustrates a partial configuration of the subpixel on the TFT substrate 100. An anode electrode (lower electrode) 162, a cathode electrode (upper electrode) 166, and an organic light-emitting film 652 are provided on an insulating substrate 151.

The subpixel is a top-emission type of subpixel that emits light from the organic light-emitting film 652 toward the side opposite from the insulating substrate 151; the cathode electrode 166 is a transparent electrode that transmits the light from the organic light-emitting film 652 toward the encapsulation substrate 200.

In FIG. 5B, the cathode electrode 166 is a part of a transparent conductive film covering the subpixel. The anode electrode 162 is formed separately for the subpixel. Part of the light from the organic light-emitting film 652 is reflected by the anode electrode 162, passes through the cathode electrode 166 and the encapsulation substrate 200, and goes out to the display surface of the display device 10. The subpixel may have a configuration such that the anode electrode is an upper electrode and the cathode electrode is a lower electrode.

The transistor T1 has a so-called top-gate structure. An IGZO film 155 of the transistor T1 and an interconnector 555 of a low-resistive IGZO film are provided on the insulating substrate 151 with a not-illustrated insulating film interposed therebetween. The IGZO film 155 of the transistor T1 includes a source region 553, a drain region 552, and a channel region 551 between the source region 553 and the drain region 552. The drain region 552 and the source region 553 are low-resistive IGZO. The interconnector 555 and the IGZO film 155 are elements on the same layer but they are separated.

The gate electrode 157 is provided above the channel region 551 of the IGZO film 155 with a gate insulating film 156 interposed therebetween. The gate electrode 157 is provided on a layer between the channel region 551 and the anode electrode 162. A first interlayer insulating film 158 and a second interlayer insulating film 164 are provided over the layer of the gate electrode 157. The drain electrode 159, the source electrode 160, and the auxiliary line 658 are provided on the second interlayer insulating film 164.

The drain electrode 159 is connected with the low-resistive drain region 552 of the IGZO film 155 through a contact 168 provided in a contact hole passing through the interlayer insulating films 164 and 158. The source electrode 160 is connected with the low-resistive source region 553 of the IGZO film 155 through a contact 169 provided in a contact hole passing through the interlayer insulating films 164 and 158.

The auxiliary line 658 is connected with the low-resistive IGZO interconnector 555 through a contact 657 provided in a contact hole passing through the interlayer insulating films 164 and 158. The drain electrode 159, the source electrode 160, the auxiliary line 658, and the contacts 168, 169, and 657 are made of a metal having a high melting point or an alloy of such a metal.

An insulative planarization film 161 is provided over the drain electrode 159, the source electrode 160, and the auxiliary line 658. An anode electrode 162 is provided on the insulative planarization film 161. The anode electrode 162 is connected with the source electrode 160 through a contact provided in a contact hole of the planarization film 161.

Above the anode electrode 162, an insulative pixel defining layer (PDL) 163 is provided to separate OLED elements. The pixel defining layer 163 is also referred to as element separating film. An OLED element includes an anode electrode 162, an organic light-emitting film 652, and a cathode electrode 166 layered one above another. An opening of the pixel defining layer 163 defines the light-emitting region of a subpixel.

The organic light-emitting film 652 is provided between the cathode electrode 166 and the anode electrode 162. A hole supply film 651 is provided between the anode electrode 162 and the organic light-emitting film 652. The hole supply film 651 can be composed of a hole injection layer and a hole transport layer or alternatively, composed of one or more layers having the functions of those layers. An electron supply film 653 is provided between the cathode electrode 166 and the organic light-emitting film 652. The electron supply film 653 can be composed of an electron injection layer and an electron transport layer or alternatively, composed of one or more layers having the functions of those layers.

In the example of FIG. 5B, the hole supply film 651 and the electron supply film 653 for one subpixel are parts of an unseparated sheet-like hole supply film and an unseparated sheet-like electron supply film (layers) covering all subpixels. One OLED element includes an anode electrode of a lower electrode, a hole supply layer, an organic light-emitting layer, an electron supply layer, and a cathode electrode of an upper electrode within an opening of the pixel defining layer 163.

The cathode electrode 166 is connected with the interconnector 555 in a contact region 656 in a contact hole passing through the laminate of the pixel defining layer 163, the planarization film 161, and the interlayer insulating films 164 and 158.

In the example of FIG. 5B, the hole supply film 651, the electron supply film 653, and a carrier generation film 654 are interposed between the interconnector 555 and the cathode electrode 166. The carrier generation film 654 generates carriers between the cathode electrode 166 and the interconnector 555 to reduce the resistance between them. The carrier generation film 654 can be made of $MoO_3$ or Mg, for example.

As indicated by the arrow in FIG. 5B, the current flows from the anode electrode 162 to the cathode electrode 166 via the hole supply film 651, the organic light-emitting film 652, and the electron supply film 653. Part of the current flows from the cathode electrode 166 to the interconnector 555 via the electron supply film 653, the carrier generation film 654, and the hole supply film 651 in the contact region 656. The current further flows from the interconnector 555 to the cathode power line through the auxiliary line 658.

Providing such a path for the current to flow through the interconnector 555 and the auxiliary line 658 other than the cathode electrode reduces the degradation in display quality caused by the cathode resistance. As illustrated in FIG. 5B, the auxiliary line 658 lies in the region covered by the anode electrode 162 on a layer lower than the light-reflective anode electrode 162. This configuration achieves a smaller active region 522.

Unlike the example in FIG. 5B, the hole supply film 651 and the electron supply film 653 can be formed separately for each subpixel. In the case of pattering the electron supply film 653 and the hole supply film 651 not to remain in the contact region 656, formation of the carrier generation film 654 can be skipped. In that case, the cathode electrode 166 is electrically connected directly with the interconnector 555 in the contact region 656, attaining an advantage of smaller contact resistance.

The electron supply film 653, the carrier generation film 654, and the hole supply film 651 can be omitted. The interconnectors for auxiliary lines and cathode electrodes can be included in only a part of the subpixels in the display region 125 and the auxiliary lines do not need to pass through all subpixels.

Although not illustrated in FIG. 5B, an encapsulation substrate 200 is fixed at a predetermined distance from the TFT substrate 100. The encapsulation substrate 200 is a transparent insulating substrate, which can be made of glass. A space is held between the TFT substrate 100 and the encapsulation substrate 200 and a gas such as dry air is tightly packed therein. Such an air-tight structure prevents moisture from entering and damaging the organic light-emitting elements. An encapsulation structural unit different from the encapsulation substrate 200 can be employed. Examples of such a structural unit include a thin film encapsulation (TFE) structural unit having a laminated structure of an inorganic film and an organic film and a flexible or inflexible encapsulation substrate made of a material having high resistance to water permeation covering the whole area.

Manufacturing Method

An example of the method of fabricating the configuration illustrated in FIG. 5B in manufacturing the OLED display device 10 is described. Manufacturing the OLED display device 10 first deposits silicon nitride, for example, onto an insulating substrate 151 by chemical vapor deposition (CVD) to form a not-illustrated insulating film.

Figure 6A:
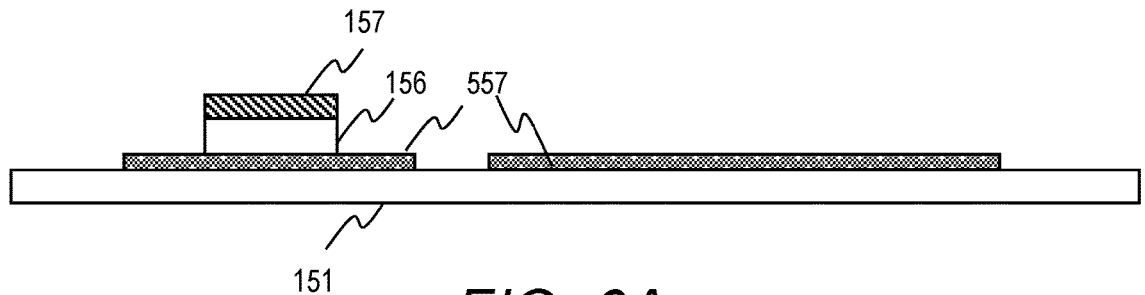
FIG. 6A illustrates a step of fabricating elements of a subpixel.

Next, as illustrated in FIG. 6A, the method forms an oxide semiconductor pattern 557 using a known oxide semiconductor TFT manufacturing technology. For example, the method deposits an oxide semiconductor (metal oxide) by magnetron sputtering and anneals it. Furthermore, the method patterns the oxide semiconductor layer by wet etching, for example.

As further illustrated in FIG. 6A, the method deposits silicon oxide on the oxide semiconductor pattern by CVD and patterns the silicon oxide to form gate insulating films 156. The method further deposits a metallic material by sputtering and patterns the metallic material to form gate electrodes 157. The gate electrodes 157 can be made of Mo, W, Nb, Al, Nd, Ti or an alloy of these metals. Scanning lines are also formed together with the gate electrodes 157.

Figure 6B:
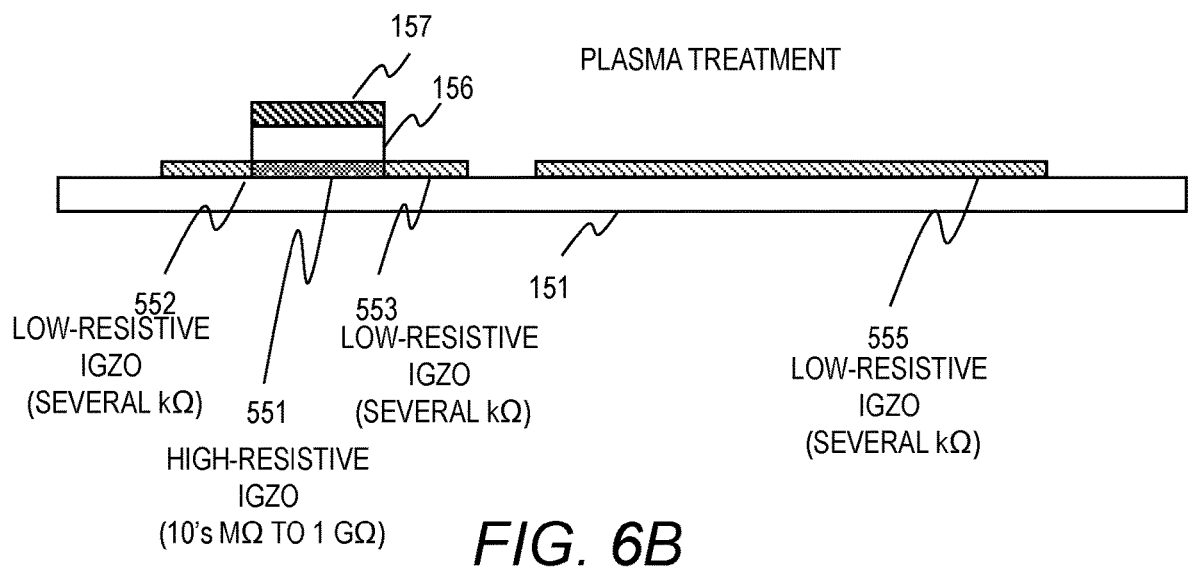
FIG. 6B illustrates a step of fabricating elements of a subpixel.

Next, as illustrated in FIG. 6B, the method applies plasma treatment onto the oxide semiconductor layer using the gate electrodes 157 as a mask to prepare low-resistive IGZO films. Since the thin film transistors have a top-gate structure, the method can efficiently prepare the low-resistive IGZO films using the gate electrodes 157 as a mask. For the plasma treatment, He, Ar, or H can be used. The plasma treatment increases oxygen deficiency in the IGZO semiconductor films to reduce the resistance. The resistance of high-resistive (semiconductor) IGZO at film formation (the sheet resistance in the case of 50-nm thickness) is several dozen megaohms to one gigaohms; the resistance of plasma-treated low-resistive IGZO is several kiloohms. Instead of the plasma treatment, excimer laser irradiation can be used to reduce the resistance of the IGZO film.

Figure 12:
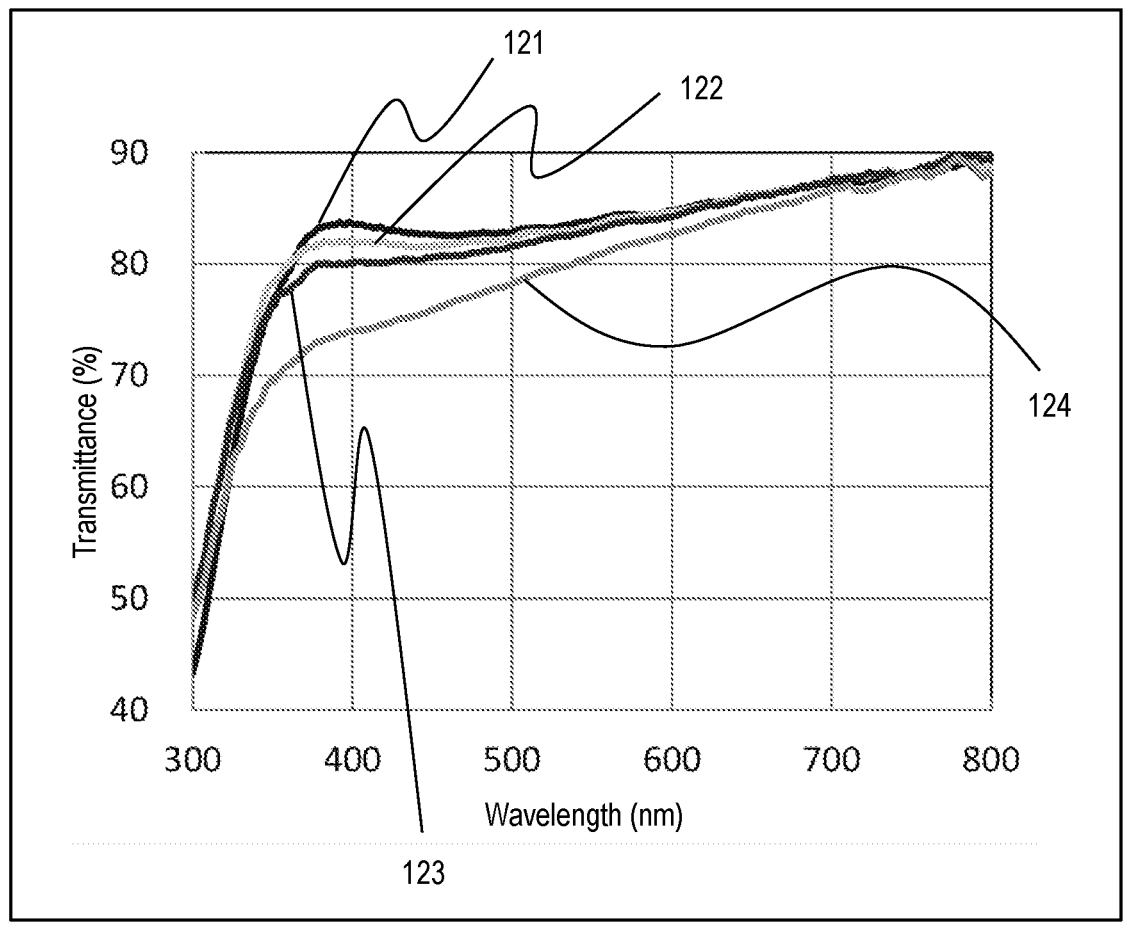
FIG. 12 provides measurement results of wavelength dependency of optical transmittance when 70-nm-thick low-resistive IGZO films are treated by He plasma at various high-frequency powers.

FIG. 12 provides measurement results of wavelength dependency of optical transmittance when 70-nm-thick low-resistive IGZO films are treated by He plasma at various high-frequency powers. The cathode electrode of the plasma generator used for the He plasma treatment has a size of approximately 400 mm×500 mm. The IGZO films were plasma-treated for 90 seconds.

The curves 122, 123, and 124 represent the measurement results on the IGZO films treated by He plasma at 250 W, 500 W, and 1700 W, respectively. The sheet resistances of the samples treated by plasma at the high-frequency powers of 250 W, 500 W, and 1700 W were all approximately 1 kΩ; the dependency of the sheet resistance on the high-frequency power was not observed. FIG. 12 further includes a transmittance measurement result 121 on a high-resistive IGZO film that was not treated by He plasma for comparison (the sheet resistance was approximately 100 MΩ).

As indicated in FIG. 12, the IGZO films treated at high-frequency powers of 250 W and 500 W can keep approximately the same transmittance as the sample untreated by He plasma, having high transparency. Such high transparency is efficient for the transparent OLED display device to keep high transmittance in its transparent regions. In contrast, the IGZO film treated at a high high-frequency power of 1700 W has a drop of transmittance at around 400 nm. Such a low-resistive film causes a problem that the transparent regions of the transparent OLED display device get colored. As understood from these results, in order to maintain the transmittance of the transparent regions at high level, an appropriate high-frequency power needs to be used in plasma treatment to reduce the resistance of the IGZO film.

Figure 13A:
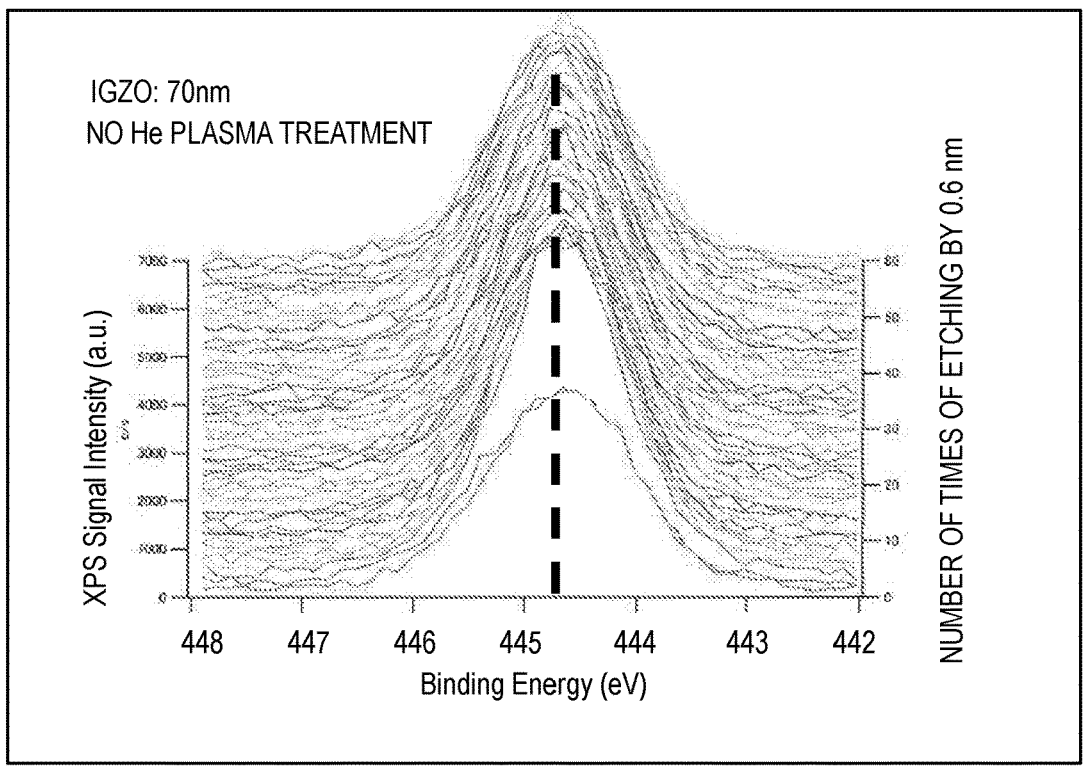
FIG. 13A provides a result of X-ray photoelectron spectroscopy (XPS) analysis on one of the IGZO films in FIG. 12.
Figure 13B:
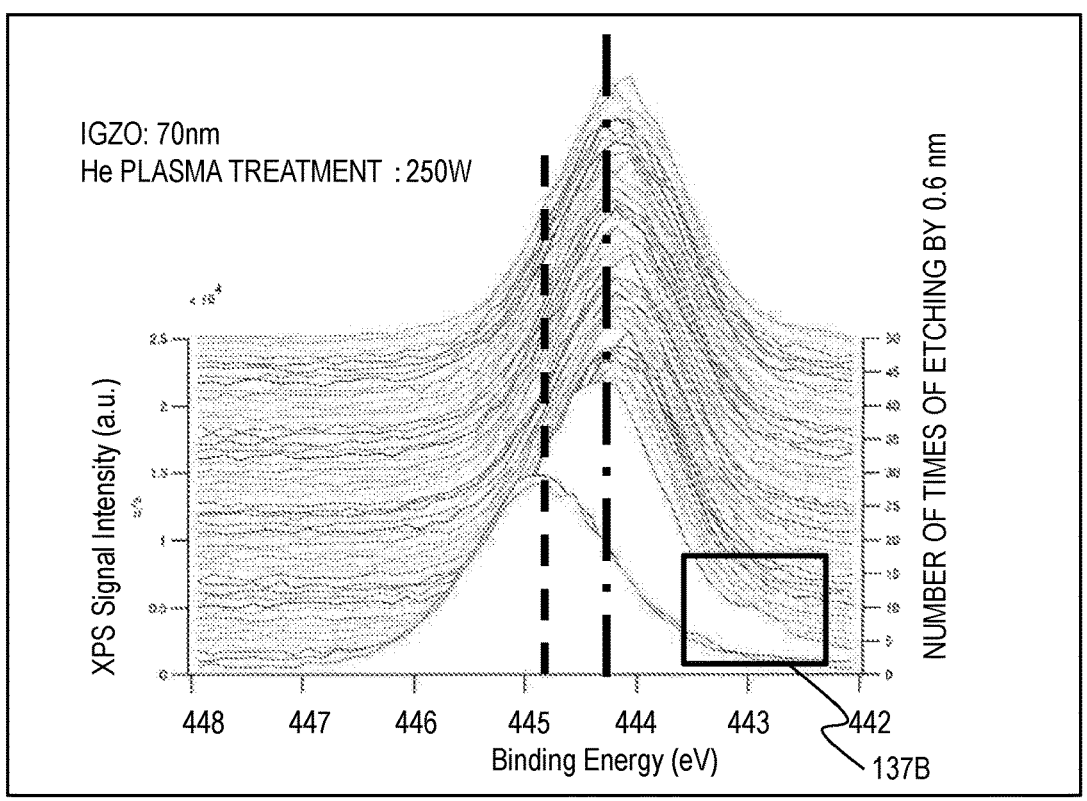
FIG. 13B provides a result of XPS analysis on one of the IGZO films in FIG. 12.
Figure 13C:
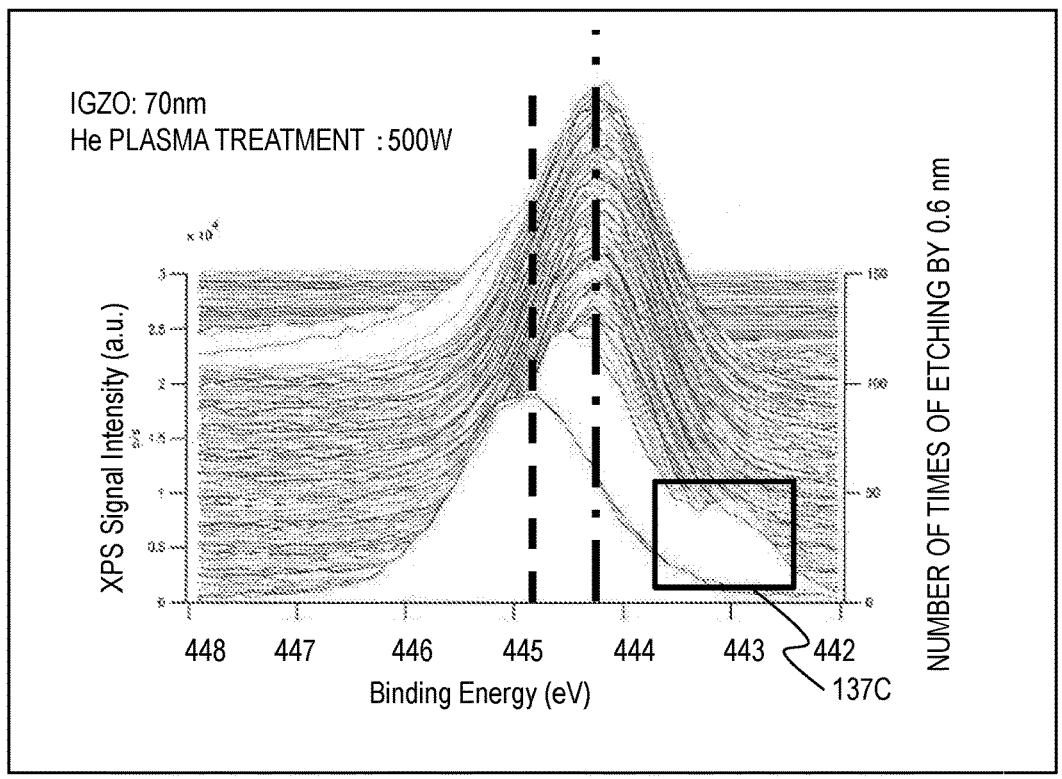
FIG. 13C provides a result of XPS analysis on one of the IGZO films in FIG. 12.
Figure 13D:
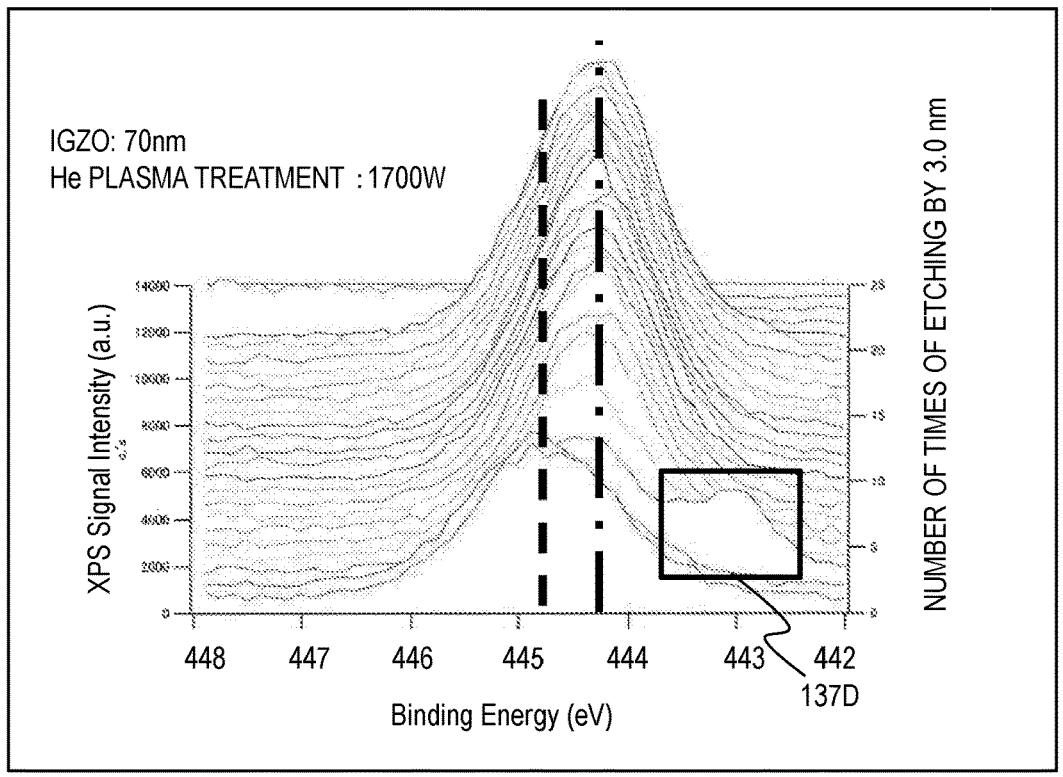
FIG. 13D provides a result of XPS analysis on one of the IGZO films in FIG. 12.

FIGS. 13A to 13D provide results of X-ray photoelectron spectroscopy (XPS) analysis on the four IGZO films in FIG. 12. The spectrometer used for the analysis was an ULVAC PHI 5600-ci and the X-ray source therein emits monochromatic AlKα X-rays. The measurement was performed by repeating a cycle including a step of acquiring an XPS signal from the surface of the IGZO film and a step of etching the surface of the IGZO film by approximately 0.6 nm with an Ar ion gun to obtain the variation in XPS signal in the depth direction (Only FIG. 13D provides the result obtained by etching the film by 3 nm at a time).

In each of FIGS. 13A to 13D, the horizontal axis represents binding energy, the left vertical axis represents XPS signal intensity, and the right vertical axis represents the number of above-described cycles. Accordingly, the lowermost data represent the XPS signal from the very top surface before being etched and the upper data represent the XPS signals from the very top surfaces after being etched, or the XPS signals from deeper inside of the original IGZO film in the direction of thickness.

FIGS. 13A to 13D indicate a signal originating from the indium $3d_{5/2}$ orbital, which is known to have a peak within the range from approximately 444 eV to 445 eV. In order to compensate for peak shifts caused by differences in charge up of the samples, the peaks of the simultaneously measured signals originating from the carbon 1 s orbital were adjusted to 284.8 eV to correct the charge shifts.

FIG. 13A provides XPS signals of a high resistive IGZO film untreated by He plasma. From the very top surface to the deeper region of the film, the peaks were at approximately 444.8 eV, and substantially no differences were observed (the peaks are indicated by a dashed thick line).

FIG. 13B provides XPS signals of a low-resistive IGZO film treated by He plasma at a high-frequency power of 250 W. The peaks of the top surface (to the depth of approximately 1 to 2 nm) indicated by dashed thick lines were at almost the same 444.8 eV as the peaks in FIG. 13A. However, the peaks of the inside of the film were lower than 444.5 eV and were at approximately 444.3 eV as indicated by dashed thick lines with dots; they are shifted to lower energy by approximately 0.5 eV. Also, as indicated in the enclosed rectangular region 137B, a sub-peak is observed at 443.0 eV lower than 444.0 eV from a shallow layer immediately under the top surface.

FIG. 13C provides XPS signals of a low-resistive IGZO film treated by He plasma at a high-frequency power of 500 W. The peaks of the top surface (to the depth of approximately 1 to 2 nm) indicated by dashed thick lines were at almost the same 444.8 eV as the peaks in FIG. 13A. However, the peaks of the inside of the film were lower than 444.5 eV and were at approximately 444.3 eV as indicated by dashed thick lines with dots; they are shifted to lower energy by approximately 0.5 eV.

These characteristics are the same as those indicated in FIG. 13B. Meanwhile, the intensity of the signals at the sub-peaks of 443.0 eV lower than 444.0 eV observed from a shallow layer immediately under the top surface in the enclosed rectangular region 137C are higher than the one in FIG. 13B. This measurement acquired XPS signals until the 70-nm low-resistive IGZO film was etched completely. Accordingly, this data indicates that an approximately 0.5 eV low-energy shift occurred in the entire 70-nm low-resistive film.

FIG. 13D provides XPS signals of a low-resistive IGZO film treated by He plasma at a high-frequency power of 1700 W. The peaks of the top surface (to the depth of approximately 1 to 2 nm) indicated by dashed thick lines were almost the same 444.8 eV as the peaks in FIG. 13A. However, the peaks of the inside of the film were lower than 444.5 eV and were approximately 444.3 eV as indicated by dashed thick lines with dots; they are shifted to lower energy by approximately 0.5 eV. These characteristics are the same as those in FIGS. 13B and 13C.

The intensity of the signals at the sub-peaks of 443 eV observed from the shallow layer immediately under the top surface in the enclosed rectangular region 137D are still higher than the one in FIG. 13C. Since the sub-peaks indicated in FIGS. 13B to 13D are located at considerably lower energy, these shallow layers immediately under the top surface are indium-rich layers (layers having extremely high oxygen deficiency and compositionally being close to pure indium metal).

Figure 14:
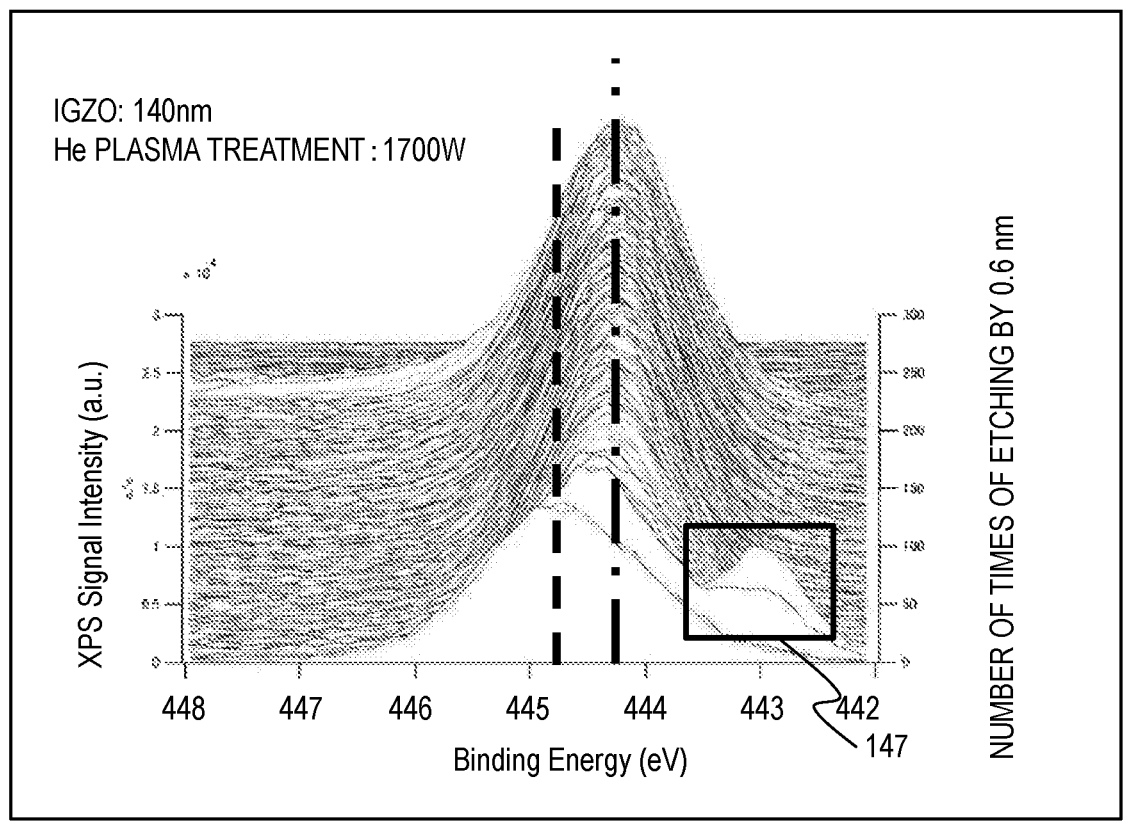
FIG. 14 provides XPS signals of a low-resistive IGZO film processed by He plasma at a high-frequency power of 1700 W.

FIG. 14 provides XPS signals of a low-resistive IGZO film treated by He plasma at a high-frequency power of 1700 W. The IGZO film used in this measurement has a thickness of 140 nm. Like in the case of the film thickness of 70 nm in FIG. 13D, peak shifts toward the lower energy by approximately 0.5 eV were observed in the inside of the film. The sub-peaks in the enclosed rectangular region 147 are high like the one indicated in FIG. 13D. The peaks are shifted toward lower energy in the entire film thickness; this indicates that the He plasma treatment affects the entire 140-nm thickness of the IGZO film.

It is commonly known that the peak of the XPS signal originating from the electronic orbital of the metallic element contained in a metal oxide film shifts toward lower energy as the oxygen deficiency in the metal oxide film becomes higher. Accordingly, the signal peaks around 444.3 eV in the inside of the film observed in FIGS. 13B to 13D (the dashed thick lines with dots) are caused by high oxygen-deficient IGZO films. The peaks at 444.8 eV at the top surface observed in FIGS. 13B to 13D are caused by a surface film naturally oxidized with time after He plasma treatment (in the surface film, the oxygen deficiency generated by the He plasma treatment has been compensated for by natural oxidization).

As understood from the above, it is important for this embodiment to have a characteristic such that the XPS signal peaks originating from the indium $3d_{5/2}$ orbital of the transparent low-resistive film and the second transparent capacitor electrode exposed to He plasma treatment are shifted toward lower energy than the XPS signal peaks originating from the indium $3d_{5/2}$ orbital of the high resistive IGZO film that is covered with the gate electrodes and unexposed to He plasma treatment. This characteristic applies to plasma treatment using not only helium gas but also argon gas or hydrogen gas.

Although the foregoing description employed the signal originating from the indium $3d_{5/2}$ orbital, the XPS signals originating from the Ga $2p_{3/2}$ orbital and the Zn $2p_{3/2}$ orbital indicated the similar peak shifts toward lower energy on the IGZO film exposed to He plasma, in comparison with the peaks obtained from the IGZO film not exposed to He plasma.

Through plasma treatment, the source region 553 and the drain region 552 of the IGZO film 155 of each TFT and the interconnector 555 between the auxiliary line 658 and the cathode electrode 166 are prepared. The interconnector 555 can be prepared efficiently by producing the interconnector 555 from low-resistive IGZO.

Figure 6C:
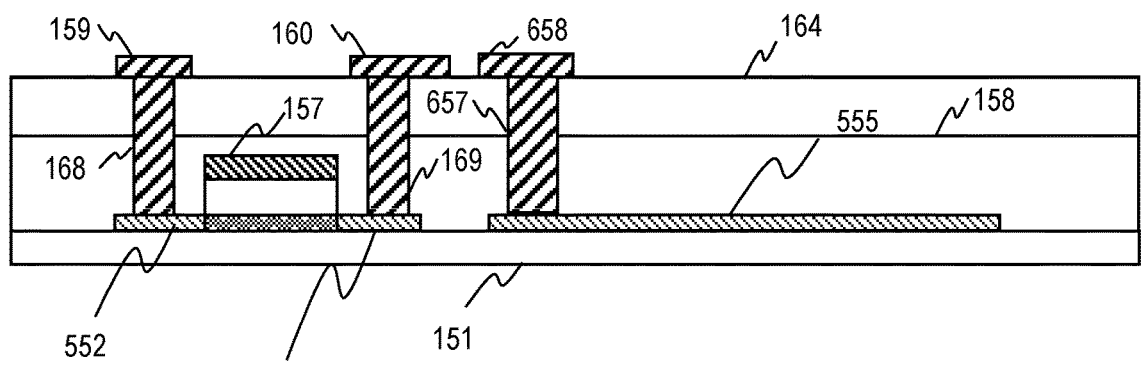
FIG. 6C illustrates a step of fabricating elements of a subpixel.

Next, as illustrated in FIG. 6C, the method deposits silicon oxide, for example, by CVD to form interlayer insulating films 158 and 164. The method opens contact holes in the interlayer insulating films 158 and 164 by anisotropic etching. The contact holes to be opened are for the contacts 168 for connecting a drain electrode 159 and the drain region 552 of an IGZO film 155, contacts 169 for connecting a source electrode 160 and the source region 553 of an IGZO film 155, and the contacts 657 for connecting an auxiliary line 658 and an interconnector 555.

Furthermore, the method deposits Mo, Al, Ti or an alloy thereof by sputtering and patterns it to form drain electrodes 159, source electrodes 160, auxiliary lines 658, and contacts 168, 169, and 657. In addition to these, data lines and power lines 108 are also formed. Forming the auxiliary lines 658 together with the drain electrodes 159 and the source electrodes 160 facilitates the manufacturing process. The drain electrodes 159, the source electrodes 160, and the auxiliary lines 658 can be formed after forming the contacts 168, 169, and 657.

Figure 6D:
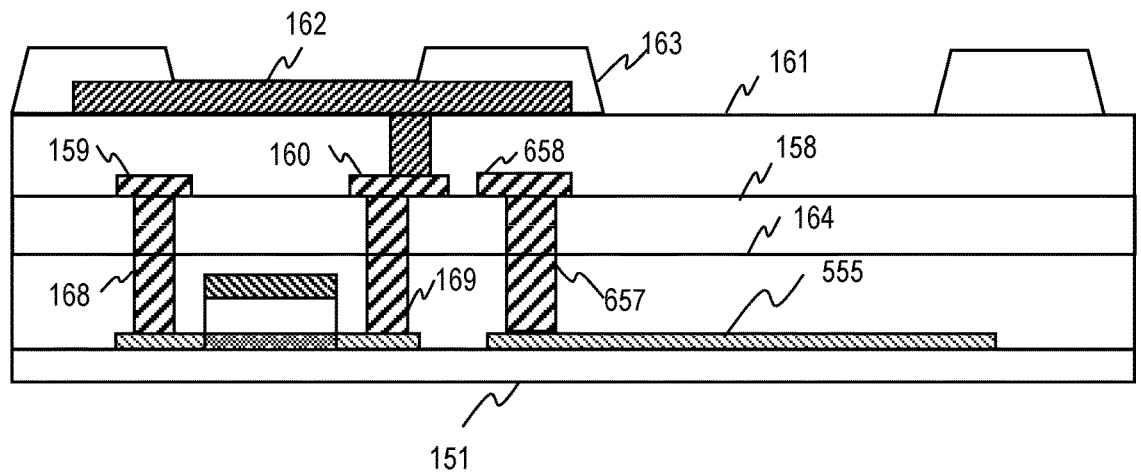
FIG. 6D illustrates a step of fabricating elements of a subpixel.

Next, as illustrated in FIG. 6D, the method deposits photosensitive organic material to form a planarization film 161 and subsequently, opens contact holes for connecting the source electrode 160 of a TFT and an anode electrode 162. The method forms anode electrodes 162 on the planarization film 161 having the contact holes.

Each anode electrode 162 includes three layers of a transparent film made of ITO, IZO, ZnO, $In_2O_3$, or the like, a reflective film made of Ag, Mg, Al, Pt, Pd, Au, Ni, Nd, Ir, Cr, or a metallic compound thereof, and another transparent film as mentioned above. The three-layer structure of the anode electrode 162 is merely an example and the anode electrode 162 may have a two-layer structure. The anode electrode 162 is connected with a source electrode 160 through a contact.

Next, the method deposits photosensitive organic resin, for example, by spin coating and patterns the photosensitive organic resin to form a pixel defining layer 163. The patterning creates holes in the pixel defining layer 163; the anode electrodes 162 of the subpixels are exposed at the bottom of the created holes. The pixel defining layer 163 separates individual light emitting regions of subpixels.

Figure 6E:
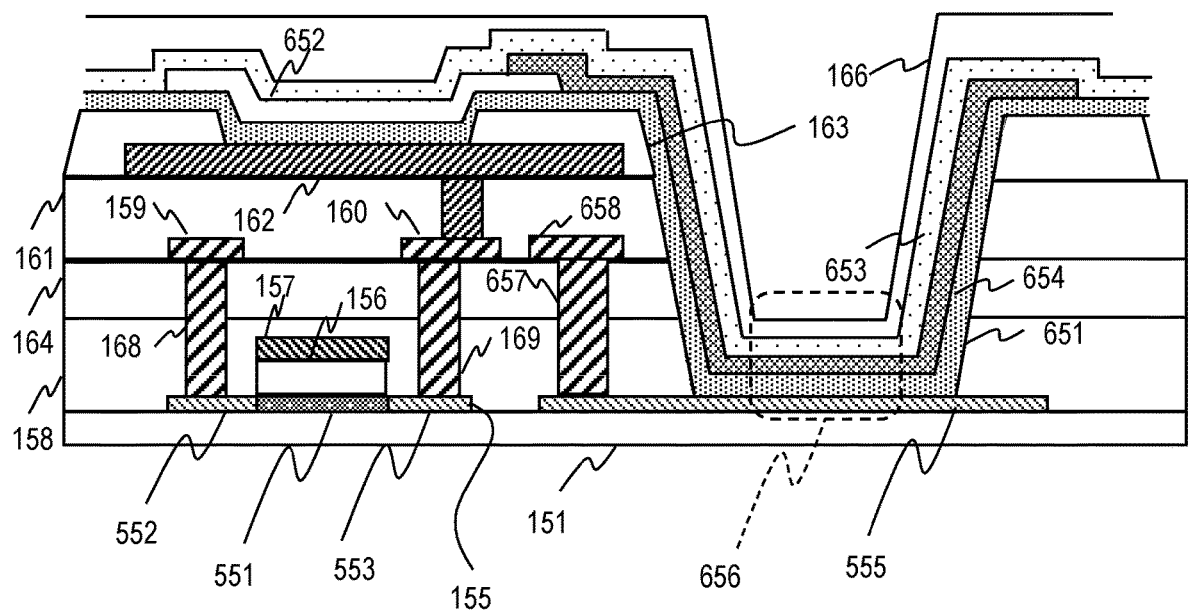
FIG. 6E illustrates a step of fabricating elements of a subpixel.

Next, as illustrated in FIG. 6E, the method forms a hole supply film 651, a carrier generation film 654, an organic light-emitting film 652, and an electron supply film 653 on the insulating substrate 151 with the pixel defining layer 163 formed thereon. These are formed by vapor deposition, for example. In forming the organic light-emitting film 652 and the carrier generation film 654, metal masks are used to form the films on specific regions. The organic light-emitting film 652 is formed separately for each of the R, G, and B colors. The material of the light-emitting layer is different depending on the color of the subpixel.

Next, the method deposits metallic material for the cathode electrode 166 onto the TFT substrate 100 to form a transparent conductive film common to the subpixels. The transparent conductive film is deposited on the pixel defining layer 163 and the electron supply film 653. As described above, the cathode electrode 166 of a subpixel is a part of the transparent conductive film common to the subpixels.

An organic light-emitting element is composed of an anode electrode 162, a cathode electrode 166, and a light-emitting film sandwiched therebetween. The light-emitting film in this example includes an electron supply film 653, an organic light-emitting film 652, and a hole supply film 651. The cathode electrode 166 is connected with the interconnector 555 through the electron supply film 653, the carrier generation film 654, and the hole supply film 651 in the contact region 656.

The transparent cathode electrode 166 is formed by vapor-depositing Li, Ca, LiF/Ca, LiF/Al, Al, or Mg, for example. The film thickness of the cathode electrode 166 is optimized to increase the light-extraction efficiency and ensure better viewing angle dependence.

Other Configurations of Subpixel

Hereinafter, other configuration examples of a subpixel are described. The configuration illustrated in FIGS. 6A to 6E includes an auxiliary line 658 made of a metal film to be the drain electrode 159 and the source electrode 160. In another configuration example, the auxiliary line 658 can be made of a metal film to be the anode electrode 162.

In the foregoing configuration example, the cathode electrode 166 of each subpixel 252 is a part of a transparent conductive film covering the subpixel. The cathode electrode 166 covers the whole area of the subpixel, inclusive of the active region 522 and the transparent region 521. Unlike this configuration, the cathode electrode 166 may be formed separately for each subpixel. The cathode electrode 166 is supplied with a source potential from the auxiliary line 658 on a lower layer. The cathode electrode 166 can partially cover the active region 522 and the transparent region 521.

Figure 7A:
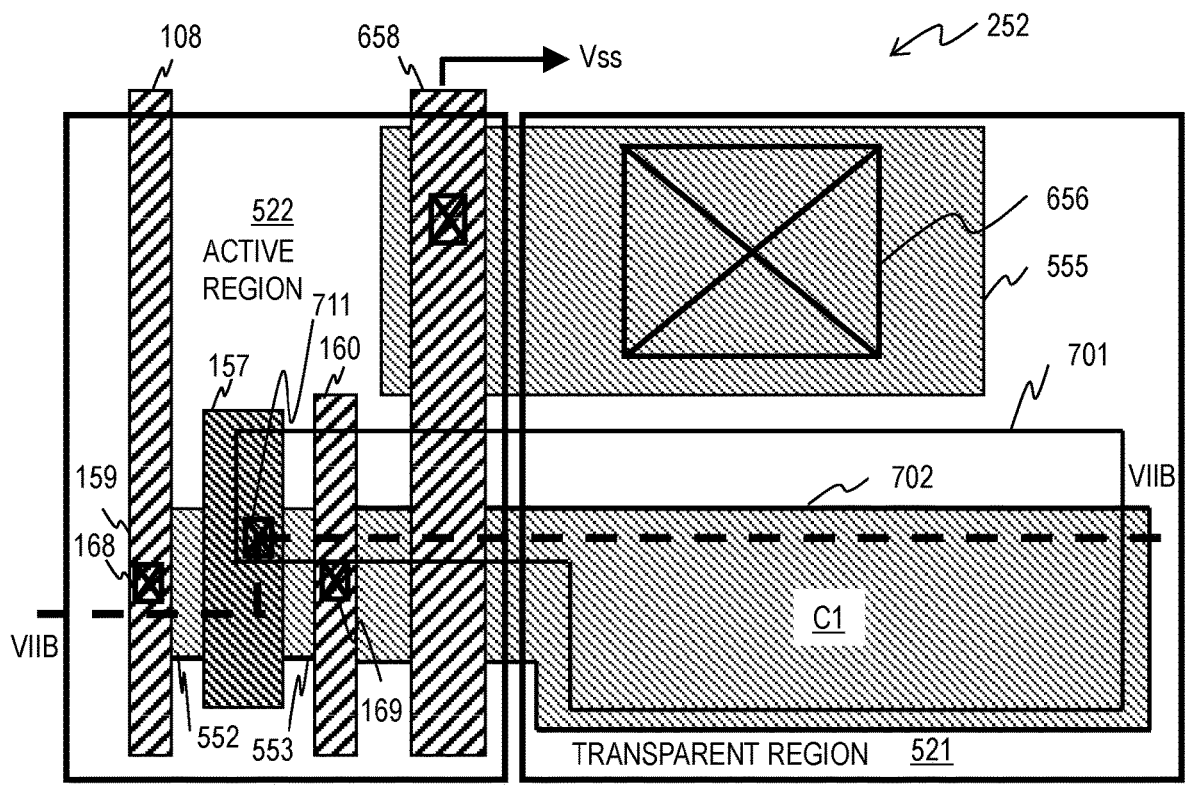
FIG. 7A is a plan diagram schematically illustrating another configuration example of a subpixel.
Figure 7B:
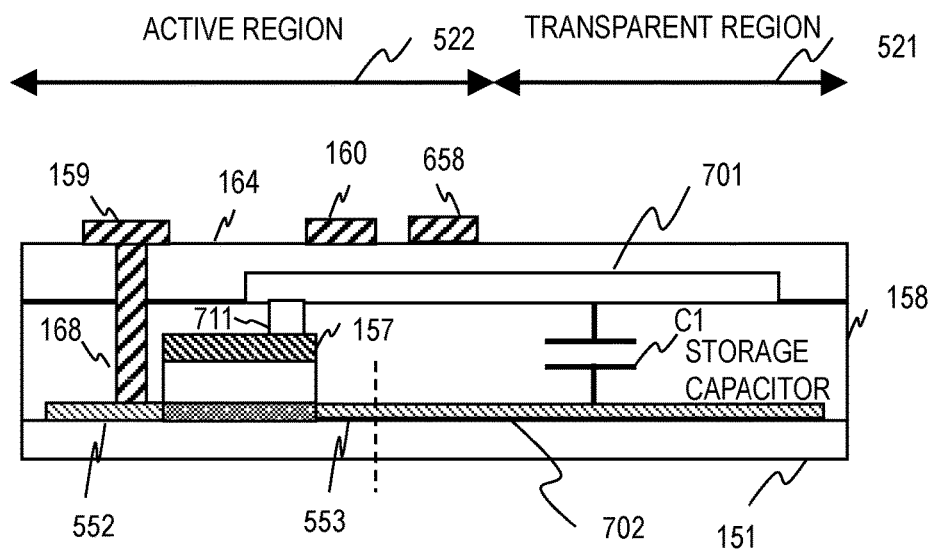
FIG. 7B is a cross-sectional diagram of the subpixel cut along the line VIIB-VIIB in FIG. 7A.

FIGS. 7A and 7B illustrate another configuration example of a subpixel 252. In the following, differences from the configuration example illustrated in FIGS. 5A and 5B are mainly described. FIG. 7A is a plan diagram schematically illustrating a configuration example of a subpixel 252. FIG. 7B is a cross-sectional diagram of the subpixel 252 cut along the line VIIB-VIIB in FIG. 7A. The configuration example illustrated in FIGS. 7A and 7B includes an upper capacitor electrode 701 and a lower capacitor electrode 702 of the storage capacitor C1 of the driving TFT T1, in addition to the configuration example illustrated in FIGS. 5A and 5B.

The upper capacitor electrode 701 is connected with the gate electrode 157 at a contact 711 in the active region 522. The upper capacitor electrode 701 extends from the active region 522 into the transparent region 521. The upper capacitor electrode 701 is a transparent electrode made of ITO or IZO, for example.

The lower capacitor electrode 702 extends continuously from the source region 553 of a contact region of the IGZO film 155 with the source electrode (second electrode) 160 of the driving TFT T1 into the transparent region 521. The lower capacitor electrode 702 is made of low-resistive IGZO.

As illustrated in FIG. 7B, the upper capacitor electrode 701 is provided on the interlayer insulating film 158. The interlayer insulating film 158 is interposed between the upper capacitor electrode 701 and the lower capacitor electrode 702. The upper capacitor electrode 701 and the lower capacitor electrode 702 are opposed to each other in the stacking direction (vertical direction) in the transparent region 521. The upper capacitor electrode 701, the lower capacitor electrode 702, and the interlayer insulating film 158 therebetween constitute the storage capacitor C1 of the driving TFT T1.

The upper capacitor electrode 701 and the lower capacitor electrode 702 are both transparent and can lie in the transparent region 521. The storage capacitor C1 can be configured in the transparent region 521 to attain a larger transparent region 521, increasing the precision of the transparent OLED display device.

For the pixel circuit configuration illustrated in FIG. 2A or 2C, it is important that the sheet resistance of the lower capacitor electrode 702 made of low-resistive IGZO be lower than the on-resistance of the driving TFT T1. Since the typical on/off ratio of the driving TFT T1 is in the order of five digits, it is important that the sheet resistance of the low-resistive IGZO be lower than that of the high-resistive IGZO by five digits or more. Specifically, it is important that the sheet resistance of the low-resistive IGZO be not more than 1 MΩ.

For the pixel circuit configuration illustrated in FIG. 2B, it is necessary that the voltage at the connection node of the storage capacitor C1 and the source terminal of the driving TFT T1 is set to Vref. It is important that the sheet resistance of the lower capacitor electrode 702 made of low-resistive IGZO be small enough so that the voltage at the aforementioned connection node can be properly set to Vref. To attain this condition, it is important that the sheet resistance of the low-resistive IGZO be lower than the sheet resistance of the high-resistive IGZO by six digits or more; specifically, it is important that the sheet resistance of the low-resistive IGZO be not more than 100 kΩ.

Figure 8A:
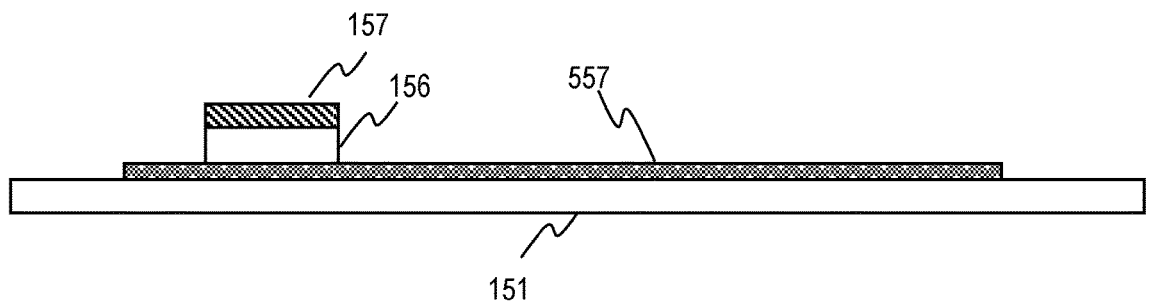
FIG. 8A illustrates a step of fabricating elements of a subpixel.

Hereinafter, a method of fabricating a partial configuration of the subpixel 252 including the storage capacitor C1 that is illustrated in FIGS. 7A and 7B is described. Differences from the method explained with reference to FIGS. 6A to 6E are mainly described. As illustrated in FIG. 8A, the method forms an oxide semiconductor pattern 557. As further illustrated in FIG. 8A, the method forms a gate insulating film 156 on the oxide semiconductor pattern 557 and further, forms a gate electrode 157.

Figure 8B:
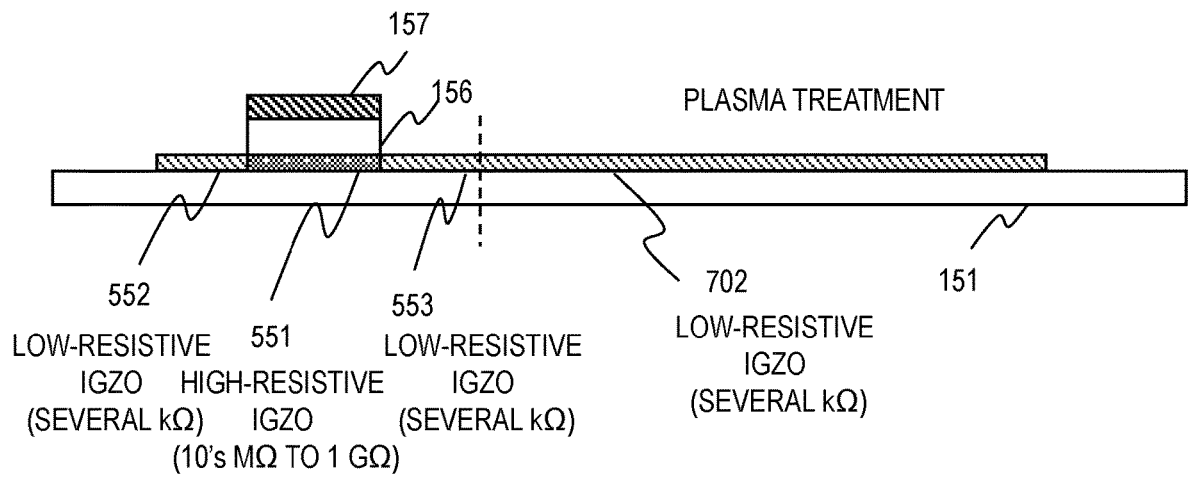
FIG. 8B illustrates a step of fabricating elements of a subpixel.

Next, as illustrated in FIG. 8B, the method applies plasma treatment onto the oxide semiconductor layer using the gate electrode 157 as a mask to prepare a low-resistive IGZO film. Through the plasma treatment, the source region 553 and the drain region 552 of the IGZO film 155 in the TFT and the lower capacitor electrode 702 of the storage capacitor C1 are prepared. The lower capacitor electrode 702 can be prepared efficiently by producing the lower capacitor electrode 702 from low-resistive IGZO.

Figure 8C:
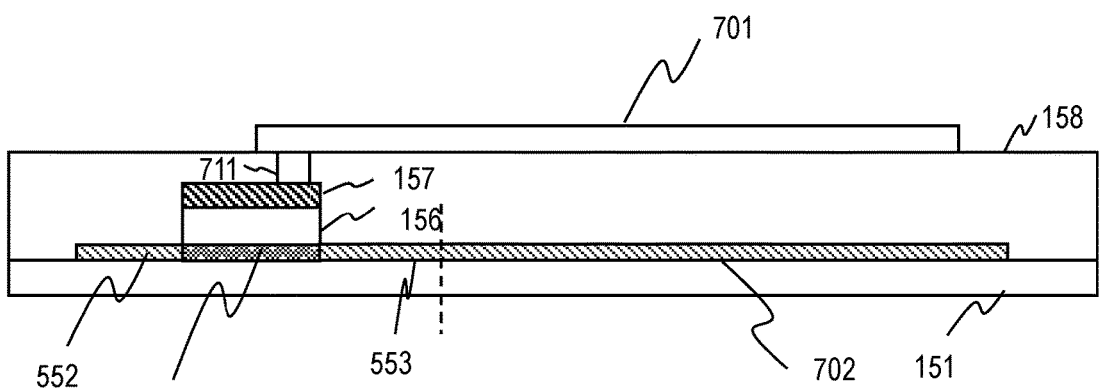
FIG. 8C illustrates a step of fabricating elements of a subpixel.

Next, as illustrated in FIG. 8C, the method forms an interlayer insulating film 158 and opens a contact hole in the interlayer insulating film 158. This contact hole is for a contact 711 to connect the upper capacitor electrode 701 of the storage capacitor C1 and the gate electrode 157. Furthermore, the method deposits ITO or IZO, for example, by sputtering to form the upper capacitor electrode 701 and the contact 711. The upper capacitor electrode 701 can be formed after the contact 711 is formed.

Figure 8D:
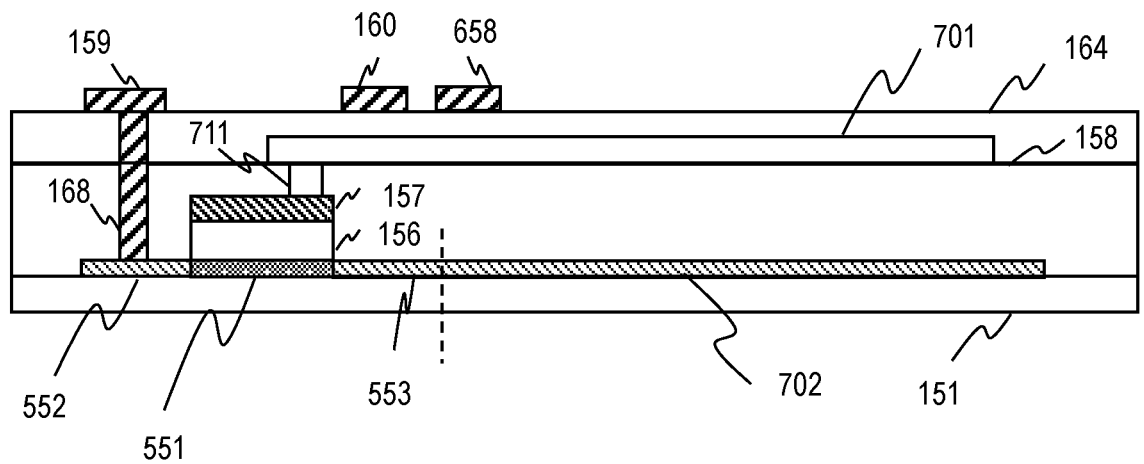
FIG. 8D illustrates a step of fabricating elements of a subpixel.

Next, as illustrated in FIG. 8D, the method forms an interlayer insulating film 164 over the upper capacitor electrode 701 and the interlayer insulating film 158. The method opens a contact hole through the interlayer insulating films 158 and 164 by anisotropy etching. The contact hole is for a contact 168 to connect the drain electrode 159 and the drain region 552 of the IGZO film 155. The method forms contact holes for other contacts together as described above. Furthermore, the method forms a drain electrode 159, a source electrode 160, an auxiliary line 658, and the contact 168.

Figure 8E:
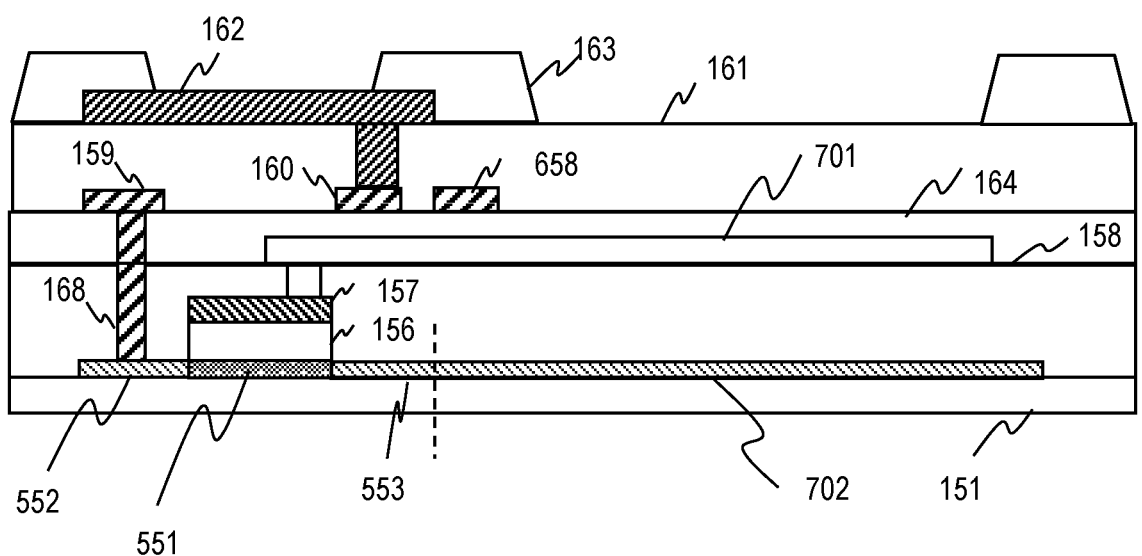
FIG. 8E illustrates a step of fabricating elements of a subpixel.

Next, as illustrated in FIG. 8E, the method forms a planarization film 161 over the drain electrode 159, the source electrode 160, the auxiliary line 658, and the interlayer insulating film 164. The method opens a contact hole for interconnecting the source electrode 160 of the TFT and the anode electrode 162 and forms the anode electrode 162 on the planarization film 161 having the contact hole. The anode electrode 162 is connected with the source electrode 160 through the contact. Furthermore, the method forms a pixel defining layer 163.

In the configuration example illustrated in FIGS. 7A and 7B, the interconnector 555 and the auxiliary line 658 can be omitted. In the circuit configuration where the storage capacitor C1 is connected with the gate terminal and the terminal on the power supply side (the terminal opposite from the anode electrode) of the driving TFT T1, the lower capacitor electrode extends from the contact region opposite from the contact region where the IGZO film is connected with the anode electrode to the transparent region 521.

Figure 9A:
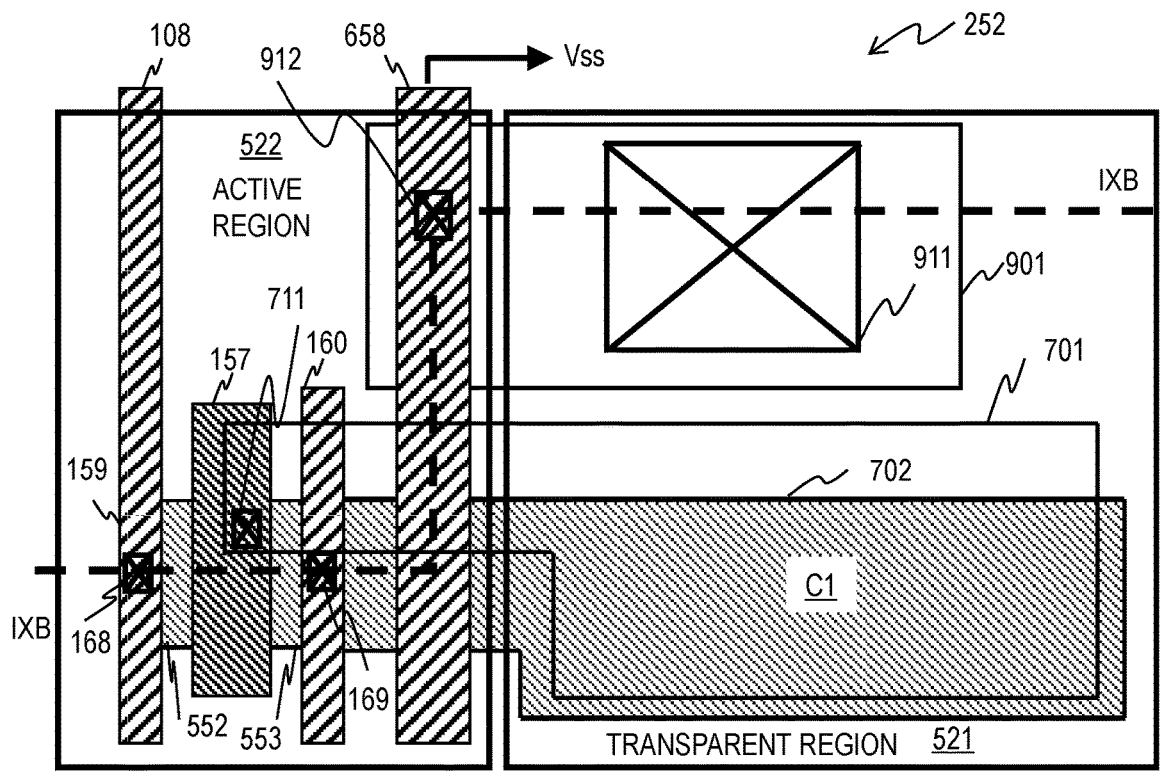
FIG. 9A is a plan diagram schematically illustrating still another configuration example of a subpixel.
Figure 9B:
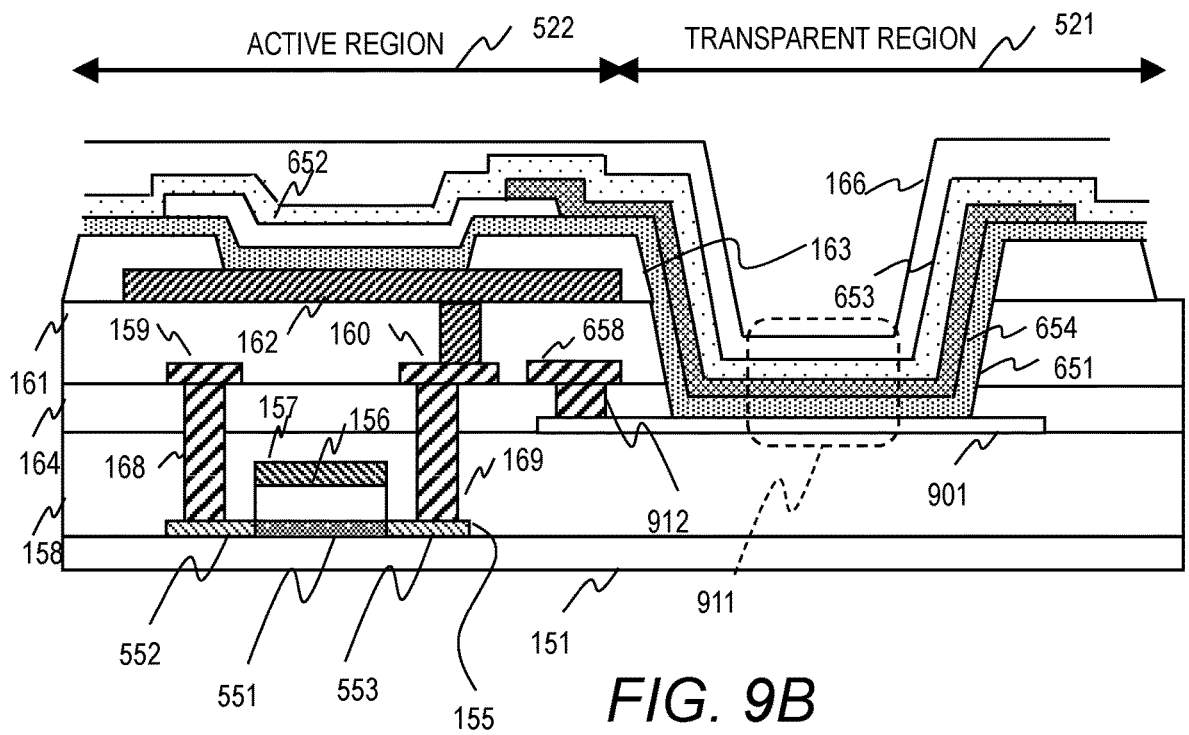
FIG. 9B is a cross-sectional diagram of the subpixel cut along the line IXB-IXB in FIG. 9A.

FIGS. 9A and 9B illustrate still another configuration example of a subpixel 252. FIG. 9B is a cross-sectional diagram of the subpixel 252 cut along the line IXB-IXB in FIG. 9A. In the following, differences from the configuration example illustrated in FIGS. 7A and 7B are mainly described. The subpixel 252 illustrated in FIGS. 9A and 9B includes an interconnector 901 in place of the interconnector 555 for the auxiliary line 658 and the cathode electrode 166.

The interconnector 901 is a transparent conductive film like the upper capacitor electrode 701 of the storage capacitor C1 and is formed on the interlayer insulating film 158. The interconnector 901 is made of the same material as the material of the upper capacitor electrode 701. The interconnector 901 is connected with the cathode electrode 166 in a contact region 911 in the transparent region 521 and connected with the auxiliary line 658 at a contact 912 in the active region 522.

The contact 912 is formed in a contact hole provided in the interlayer insulating film 164. The contact 912 can be made of the same material as the material of the auxiliary line 658. The cathode electrode 166 is connected with the interconnector 901 in the contact region 911 in a contact hole passing through the pixel defining layer 163, the planarization film 161, and the interlayer insulating film 164 laminated together.

The interconnector 901 can be formed in the same process as (together with) the upper capacitor electrode 701 of the storage capacitor C1. Accordingly, the interconnector 901 can be formed efficiently.

Figure 10:
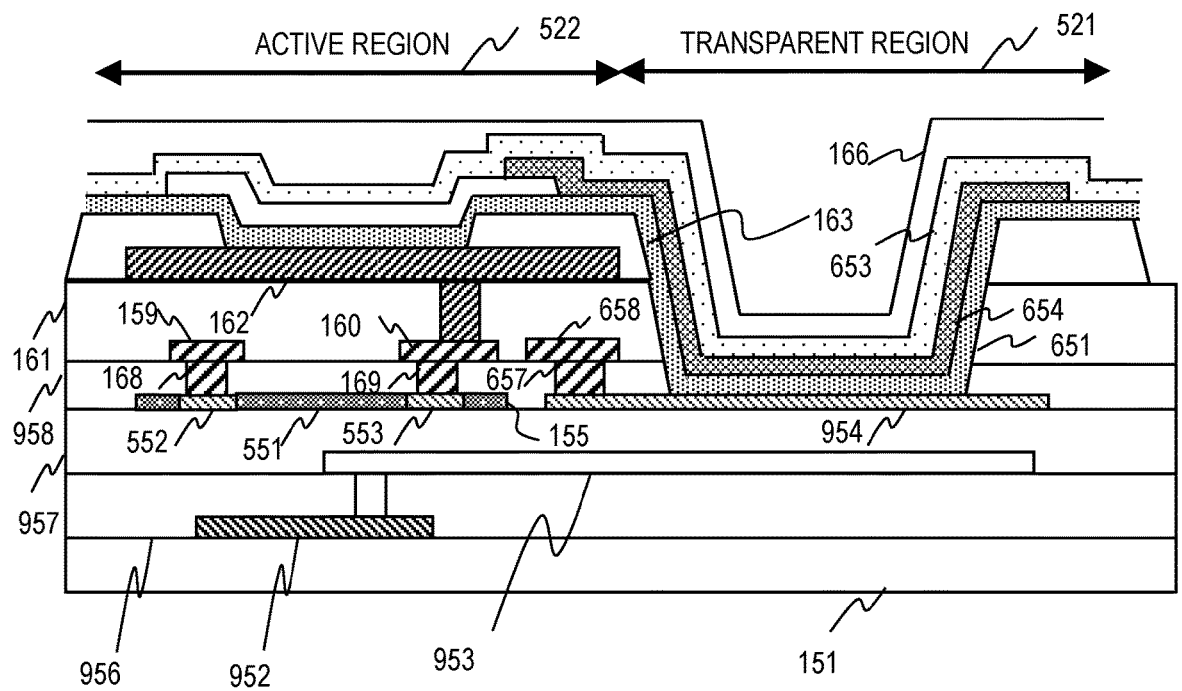
FIG. 10 is a cross-sectional diagram illustrating still another configuration example of a subpixel.
Figure 11:
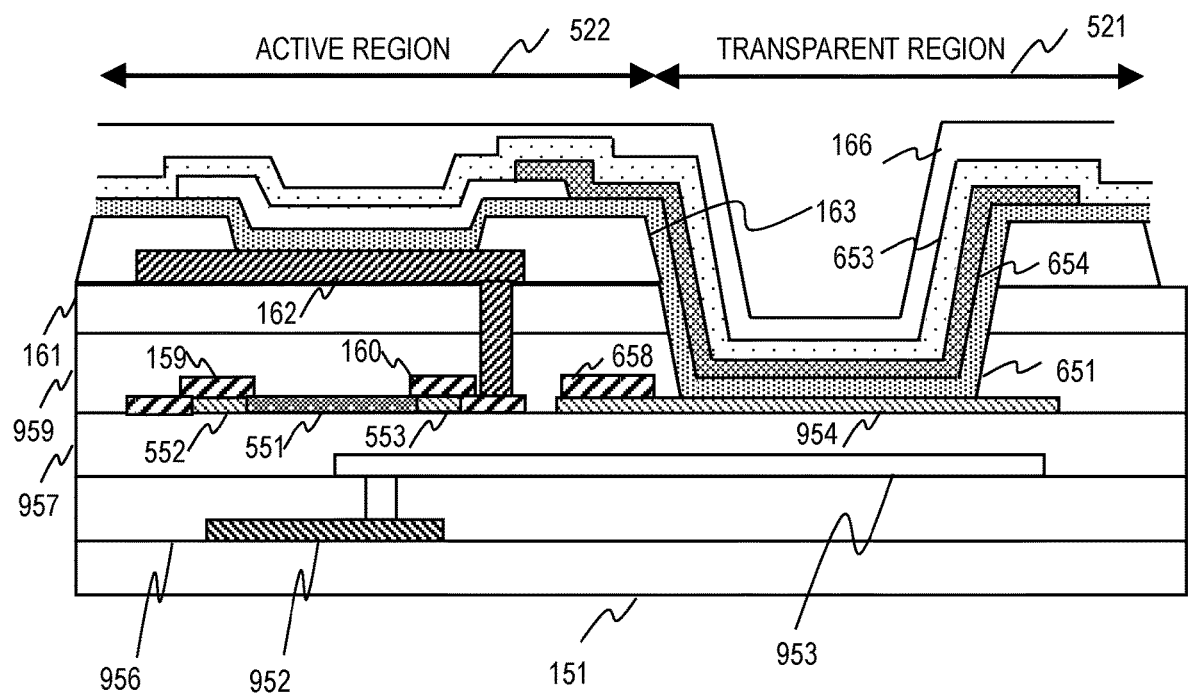
FIG. 11 is a cross-sectional diagram illustrating still another configuration example of a subpixel.

FIGS. 10 and 11 each illustrate still another configuration example of a subpixel 252. In the configuration examples illustrated in FIGS. 10 and 11, the driving TFT T1 is of a bottom-gate type. The driving TFT T1 in FIG. 10 has an etch stop film. In the configuration example in FIG. 10, the bottom gate electrode 952 is provided on the transparent insulating substrate 151. Typically, an insulating film such as a silicon nitride film is interposed between the bottom gate electrode 952 and the substrate 151. An insulating film 956 is provided over the bottom gate electrode 952 and the substrate 151. The insulating film 956 can be a silicon oxide film.

A lower capacitor electrode 953 of the storage capacitor C1 is provided on the insulating film 956. The lower capacitor electrode 953 is connected with the bottom gate electrode 952 at a contact provided in a contact hole of the insulating film 956 in the active region 522. The lower capacitor electrode 953 is a transparent conductive film and extends from the active region 522 into the transparent region 521. The lower capacitor electrode 953 can be made of ITO or IZO.

The lower capacitor electrode 953 is opposed to a not-illustrated upper capacitor electrode across an insulating film in the transparent region 521. Specifically, the upper capacitor electrode extends continuously from the source region 553 of the IGZO film 155 of the driving TFT T1 into the transparent region 521. The upper capacitor electrode and the lower capacitor electrode 953 are opposed to each other across the insulating film 957 in the transparent region 521.

An insulating film 957 is provided over the insulating film 956 and the lower capacitor electrode 953. On the insulating film 957, an IGZO film 155 of the driving TFT T1 and an interconnector 954 for the cathode electrode 166 and the auxiliary line 658 are provided. The interconnector 954 is separated from the IGZO film 155. The interconnector 954 is a transparent low-resistive film made of low-resistive IGZO and produced together with the low-resistive region of the IGZO film 155 of the driving TFT T1 in the same process.

An insulating film 958 is provided over the IGZO film 155, the interconnector 954, and the insulating film 957. The insulating film 958 is an etch stop film. On the insulating film 958, a drain electrode 159, a source electrode 160, and an auxiliary line 658 are provided. In contact holes provided in the insulating film 958 in the active region 522, contacts 168, 169, and 657 are provided.

The drain electrode 159 is connected with the drain region 552 of the IGZO film 155 at the contact 168. The source electrode 160 is connected with the source region 553 of the IGZO film 155 at the contact 169.

The interconnector 954 is connected with the auxiliary line 658 at the contact 657. The interconnector 954 is further connected with the cathode electrode 166 through a contact region in the transparent region 521. The cathode electrode 166 is connected with the interconnector 954 through the contact region in a contact hole passing through the pixel defining layer 163, the planarization film 161, and the insulating film 958 laminated together. The layer configuration of the planarization film 161 and the layers upper than the planarization film 161 is the same as the configuration described with reference to FIG. 5B.

The driving TFT T1 illustrated in FIG. 11 is a bottom-gate TFT of channel etch type. In the following, differences from the configuration example illustrated in FIG. 10 are mainly described. In the configuration example of FIG. 11, an insulating film 959 is formed instead of the insulating film 958 in the configuration example in FIG. 10. The drain electrode 159 and the source electrode 160 are directly in contact with the drain region 552 and the source region 553, respectively, of the IGZO film 155. The auxiliary line 658 is directly in contact with the interconnector 954.

As described above, the interconnector made of low-resistive IGZO for connecting the auxiliary line and the cathode electrode is applicable to pixel configurations including a driving TFT having a bottom-gate structure.

As set forth above, embodiments of this disclosure have been described; however, this disclosure is not limited to the foregoing embodiments. Those skilled in the art can easily modify, add, or convert each element in the foregoing embodiment within the scope of this disclosure. A part of the configuration of one embodiment can be replaced with a configuration of another embodiment or a configuration of an embodiment can be incorporated into a configuration of another embodiment.

What is claimed is:

1. A display device comprising:
a substrate;
a plurality of pixels formed on the substrate, each of the plurality of pixels including a transparent first region and a second region different from the first region; and
a power-source potential supply line lying through the second regions of the plurality of pixels and connected with a power line at outside of the plurality of pixels,
wherein each of the plurality of pixels includes:
  a transparent upper electrode covering at least a part of the first region and at least a part of the second region;
  a reflective lower electrode disposed in the second region;
  a light-emitting film disposed between the transparent upper electrode and the reflective lower electrode, the light-emitting film being configured to emit light in response to supplied electric current;
  a thin film transistor disposed lower than the reflective lower electrode in the second region, the thin film transistor having a channel made of a transparent oxide; and
  a transparent low-resistive film consisting of the transparent oxide and interconnects the power-source potential supply line and the transparent upper electrode, the transparent low-resistive film being separate from an oxide film consisting of the transparent oxide and includes the channel and having a resistance lower than a resistance of the channel,
wherein the transparent low-resistive film is connected with the transparent upper electrode in the first region, and
wherein the transparent low-resistive film is connected with the power-source potential supply line in the second region.

2. The display device according to claim 1, wherein the transparent upper electrode is a part of a transparent conductive film covering the plurality of pixels and connected with the power line at outside of the plurality of pixels and covers the whole area of the first region and the second region.

3. The display device according to claim 1,
wherein each of the plurality of pixels includes a storage capacitor between a gate electrode of the thin film transistor and a second electrode that is either a source electrode or a drain electrode of the thin film transistor,
wherein the storage capacitor includes:
  a first transparent capacitor electrode connected with the gate electrode in the second region and extending into the first region;
  a second transparent capacitor electrode that is a part of the oxide film including the channel, extends continuously from a contact region of the oxide film with the second electrode into the first region, and has a resistance lower than the resistance of the channel; and
  an insulating film between the first transparent capacitor electrode and the second transparent capacitor electrode, and
wherein at least a part of the first transparent capacitor electrode and at least a part of the second transparent capacitor electrode are opposed to each other across the insulating film in the first region.

4. The display device according to claim 3, wherein one of the following conditions is satisfied:
that peaks of X-ray Photoelectron Spectroscopy (XPS) spectra originating the indium $3d_{5/2}$ orbital of the transparent low-resistive film and the second transparent capacitor electrode are shifted to lower energy than peaks of XPS spectra originating the indium $3d_{5/2}$ orbital of the channel made of the transparent oxide;
that peaks of XPS spectra originating the gallium $2p_{3/2}$ orbital of the transparent low-resistive film and the second transparent capacitor electrode are shifted to lower energy than peaks of XPS spectra originating the gallium $2p_{3/2}$ orbital of the channel made of the transparent oxide; and
that peaks of XPS spectra originating the zinc $2p_{3/2}$ orbital of the transparent low-resistive film and the second transparent capacitor electrode are shifted to lower energy than peaks of XPS spectra originating the zinc $2p_{3/2}$ orbital of the channel made of the transparent oxide.

5. The display device according to claim 3, wherein peaks of XPS spectra originating the indium $3d_{5/2}$ orbital of the transparent low-resistive film and the second transparent capacitor electrode are located at energies lower than 444.5 eV.

6. The display device according to claim 3, wherein XPS spectra originating the indium $3d_{5/2}$ orbital of the transparent low-resistive film and the second transparent capacitor electrode have sub-peaks at energies lower than 444.0 eV.

7. The display device according to claim 1,
wherein the transparent oxide is IGZO, and
wherein the transparent low-resistive film is more oxygen-deficient than the channel.

8. The display device according to claim 1, wherein the power-source potential supply line is located lower than the reflective lower electrode and lies through a region covered by the reflective lower electrode.

9. The display device according to claim 8, wherein the power-source potential supply line is made of the same material as the source electrode and the drain electrode of the thin film transistor and provided on the same insulating film on which the source electrode and the drain electrode are provided.

10. The display device according to claim 1, wherein the power-source potential supply line is made of the same metal film as the reflective lower electrode.

11. The display device according to claim 1, wherein the gate electrode of the thin film transistor is provided on a layer between the channel and the reflective lower electrode.

12. The display device according to claim 11, wherein one of the following conditions is satisfied:
that peaks of XPS spectra originating the indium $3d_{5/2}$ orbital of the transparent low-resistive film are shifted to lower energy than peaks of XPS spectra originating the indium $3d_{5/2}$ orbital of the channel made of the transparent oxide covered by the gate electrode and located lower than the gate electrode;
that peaks of XPS spectra originating the gallium $2p_{3/2}$ orbital of the transparent low-resistive film are shifted to lower energy than peaks of XPS spectra originating the gallium $2p_{3/2}$ orbital of the transparent oxide covered by the gate electrode and located lower than the gate electrode; and
that peaks of XPS spectra originating the zinc $2p_{3/2}$ orbital of the transparent low-resistive film are shifted to lower energy than peaks of XPS spectra originating the zinc $2p_{3/2}$ orbital of the transparent oxide covered by the gate electrode and located lower than the gate electrode.

13. The display device according to claim 11, wherein peaks of XPS spectra originating the indium $3d_{5/2}$ orbital of the transparent low-resistive film are located at energies lower than 444.5 eV.

14. The display device according to claim 11, wherein XPS spectra originating the indium $3d_{5/2}$ orbital of the transparent low-resistive film have sub-peaks at energies lower than 444.0 eV.

15. The display device according to claim 1, wherein the transparent low-resistive film has a sheet resistance not more than 1 MΩ.

16. A display device comprising:
a substrate; and
a plurality of pixels formed on the substrate, each of the plurality of pixels including a first region that transmits light and a second region different from the first region,
wherein each of the plurality of pixels includes:
a transparent upper electrode covering at least a part of the first region and at least a part of the second region;
a reflective lower electrode disposed in the second region;
a light-emitting film disposed between the transparent upper electrode and the reflective lower electrode, the light-emitting film being configured to emit light in response to supplied electric current;
a thin film transistor disposed lower than the reflective lower electrode in the second region, the thin film transistor including a gate electrode, a source electrode, a drain electrode, and an oxide film made of a transparent oxide that includes a channel;
a first transparent capacitor electrode connected with the gate electrode in the second region and extending into the first region;
a second transparent capacitor electrode which is a part of the oxide film, extends continuously from a contact region of the oxide film with a second electrode, which is either the source electrode or the drain electrode, into the first region, and has a resistance lower than a resistance of the channel; and
an insulating film between the first transparent capacitor electrode and the second transparent capacitor electrode, and
wherein at least a part of the first transparent capacitor electrode and at least a part of the second transparent capacitor electrode are opposed to each other across the insulating film in the first region to be a storage capacitor between the gate electrode and the second electrode.

17. The display device according to claim 16, wherein the transparent upper electrode is a part of a transparent conductive film covering the plurality of pixels and connected with a power line at outside of the plurality of pixels and covers the whole area of the first region and the second region.

18. The display device according to claim 17,
wherein each of the plurality of pixels further includes:
an auxiliary line lying through the second region and connected with the power line at outside of the plurality of pixels; and
a transparent interconnector which is made of the same material, provided on the same layer as the first transparent capacitor electrode at a distance from the first transparent capacitor electrode, connected with the transparent upper electrode in the first region, and connected with the auxiliary line in the second region.

19. The display device according to claim 16, wherein the second transparent capacitor electrode has a sheet resistance not more than on-resistance of the channel.

20. The display device according to claim 16, wherein the gate electrode of the thin film transistor is provided on a layer between the channel and the reflective lower electrode.

* * * * *